(12) United States Patent
Vermeer et al.

(10) Patent No.: US 8,658,521 B2
(45) Date of Patent: Feb. 25, 2014

(54) METHOD AND DEVICE FOR LAYER DEPOSITION

(75) Inventors: Adrianus Johannes Petrus Maria Vermeer, Geldrop (NL); Hugo Anton Marie De Haan, Son (NL)

(73) Assignees: Nederlandse Organisatie voor toegepast-natuurwetenschappelijk onderzoek TNO, Delft (NL); Vision Dynamics Holding B.V., Eindhoven (NL)

( * ) Notice: Subject to any disclaimer, the term of this patent is extended or adjusted under 35 U.S.C. 154(b) by 0 days.

(21) Appl. No.: 13/579,765

(22) PCT Filed: Feb. 23, 2011

(86) PCT No.: PCT/NL2011/050128
§ 371 (c)(1),
(2), (4) Date: Sep. 30, 2012

(87) PCT Pub. No.: WO2011/105898
PCT Pub. Date: Sep. 1, 2011

(65) Prior Publication Data
US 2013/0012029 A1 Jan. 10, 2013

(30) Foreign Application Priority Data
Feb. 25, 2010 (EP) .................................... 10154753

(51) Int. Cl.
*H01L 21/20* (2006.01)
(52) U.S. Cl.
USPC .................. 438/507; 438/680; 257/E21.311; 118/723 R

(58) Field of Classification Search
USPC ............ 438/771, 776; 257/E21.297, E21.299
See application file for complete search history.

(56) References Cited

U.S. PATENT DOCUMENTS

| | | | |
|---|---|---|---|
| 2001/0010112 A1 | 8/2001 | Maeda | |
| 2002/0069827 A1 | 6/2002 | Sakamoto et al. | |
| 2005/0011752 A1 | 1/2005 | Yamazaki et al. | |
| 2008/0226838 A1* | 9/2008 | Nishimura et al. | ........... 427/569 |

OTHER PUBLICATIONS

International Search Report for PCT/NL2011/050128, mailed Mar. 23, 2011.

* cited by examiner

*Primary Examiner* — Cheung Lee
(74) *Attorney, Agent, or Firm* — Waddey & Patterson, P.C.; Rebecca M. Barnett

(57) ABSTRACT

Method for depositing a layer on a surface of a substrate. The method comprises injecting a precursor gas from a precursor supply into a deposition cavity for contacting the substrate surface, draining part of the injected precursor gas from the deposition cavity, and positioning the deposition cavity and the substrate relative to each other along a plane of the substrate surface. The method further comprising providing a first electrode and a second electrode, positioning the first electrode and the substrate relative to each other, and generating a plasma discharge near the substrate for contacting the substrate by generating a high-voltage difference between the first electrode and the second electrode. The method comprises generating the plasma discharge selectively, for patterning the surface by means of the plasma. A portion of the substrate contacted by the precursor gas selectively overlaps with a portion of the substrate contacted by the plasma.

15 Claims, 14 Drawing Sheets

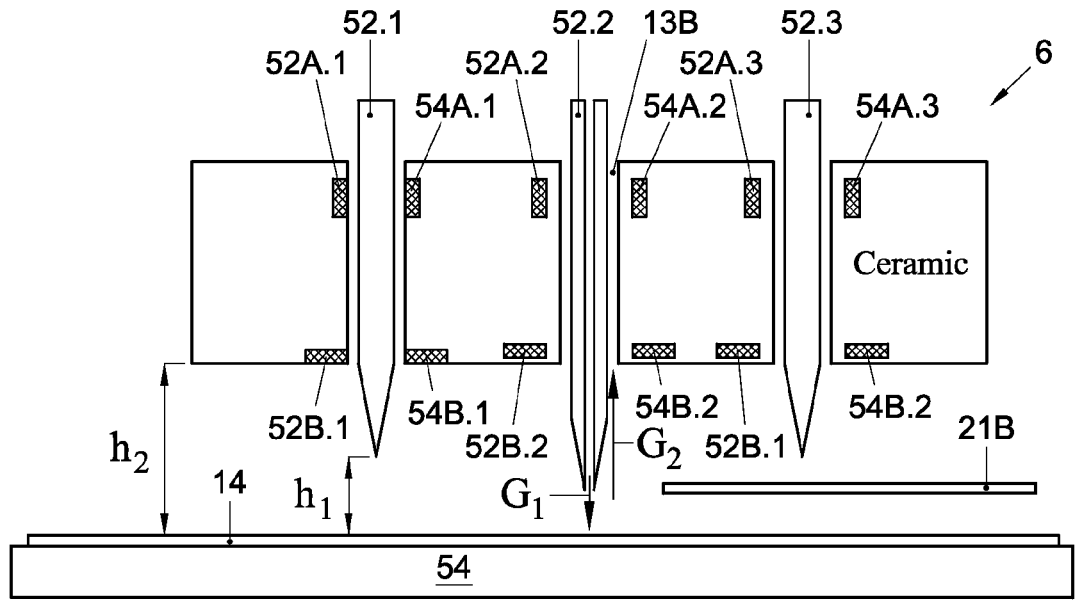
Fig. 5A
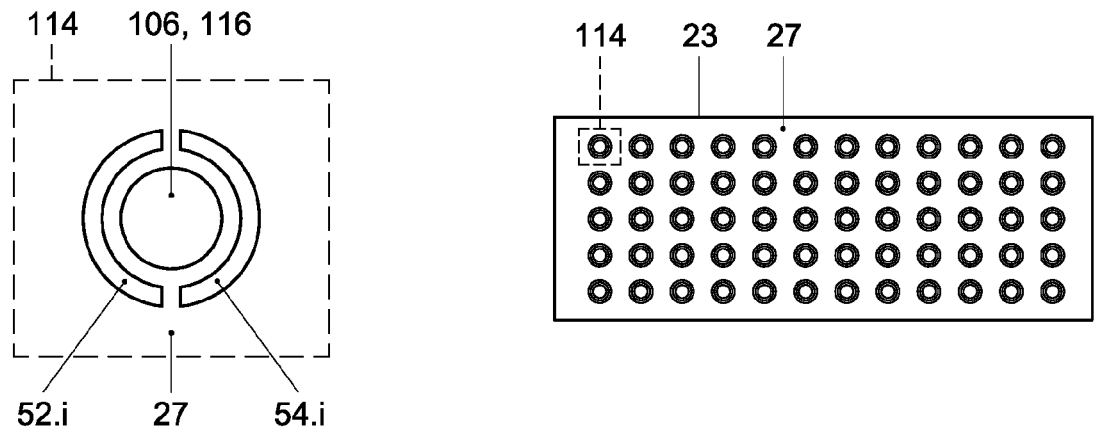
Fig. 5C
Fig. 5B

METHOD AND DEVICE FOR LAYER DEPOSITION

The invention relates to a method for depositing a layer, such as an atomic layer or a chemical vapour deposition layer, on a surface by means of a deposition device, such as an atomic layer deposition device or a chemical vapour deposition device. The invention also relates to an apparatus comprising a deposition device for layer deposition, such as atomic layer deposition or chemical vapour deposition, on a surface of a substrate. The invention further relates to a method for manufacturing a light-emitting diode or a mesoscale electronics device.

Atomic layer deposition is known as a method for depositing a monolayer of target material. Chemical vapour deposition is known as a method for depositing a thicker layer of target material. Atomic layer deposition differs from chemical vapour deposition in that atomic layer deposition takes at least two process steps. A first one of these process steps comprises application of a precursor gas on the substrate surface. A second one of these process steps comprises reaction of the precursor material in order to form the monolayer of target material. Atomic layer deposition has the advantage of enabling a good layer thickness control. Known methods and apparatuses are therefore used for blanket deposition of uniform atomic layers. When thicker layers are required, blanket deposition by chemical vapour deposition may be used.

It is an object of the invention to provide an improved method for depositing a layer, such as an atomic layer of a chemical vapour deposition layer, on a surface of a substrate.

Thereto the invention provides a method for depositing a layer, such as an atomic layer or a chemical vapour deposition layer, on a surface of a substrate by means of a deposition device, such as an atomic layer deposition device or a chemical vapour deposition device, the deposition device comprising a deposition cavity provided with a precursor supply and a precursor drain, the deposition cavity in use being bounded by the deposition device and the substrate surface, the method comprising injecting a precursor gas from the precursor supply into a deposition cavity for contacting the substrate surface, draining part of the injected precursor gas from the deposition cavity, and positioning the deposition cavity and the substrate relative to each other along a plane of the substrate surface, the method further comprising providing a first electrode and a second electrode, positioning the first electrode and the substrate relative to each other, and, preferably repeatedly, generating a plasma discharge near the substrate for contacting the substrate by generating a high-voltage difference between the first electrode and the second electrode, wherein the method comprises generating the plasma discharge selectively, e.g. intermittently, in time and/or position, for patterning the surface of the substrate by means of the plasma so that a portion of the substrate contacted by the precursor gas selectively, e.g. intermittently, overlaps with a portion of the substrate contacted by the plasma, the method further including forming a gas-bearing layer by injecting, by means of a bearing-gas injector of the apparatus, a bearing gas between the apparatus and the substrate surface. By such a combination of, on the one hand, patterning the surface by means of the plasma discharge, and, on the other hand, layer deposition, patterned layers can be obtained, as a plasma treatment can interact with the layer deposition process. When using known methods, obtaining a patterned layer would require additional process steps (e.g. lithography) to be carried out on a layer obtained after blanket deposition.

The portion of the substrate contacted, e.g. treated, by the precursor gas selectively overlapping with the portion of the substrate contacted, e.g. treated, by the plasma can for example mean that the portion of the substrate contacted by the precursor gas corresponds with a larger surface area than the portion of the substrate contacted by the plasma. Alternatively, or additionally, it can mean that the portion of the substrate contacted by the plasma is, along an imaginary line that crosses, and stays within, the portion of the substrate contacted by the precursor gas, intermittently, i.e. non-continuously, present on the substrate. Other ways of selective overlap are possible as well, which depend on the pattern that is created by the plasma.

Generating the plasma discharge selectively in time can for example mean that the plasma is generated non-continuously or intermittently in time, while the first electrode is positioned, e.g. moved, along the portion of the substrate contacted by the precursor gas. Generating the plasma discharge selectively in position can for example mean that the plasma is generated at an amount of first regions along the portion of the substrate contacted by the precursor gas, and is not generated at other second regions along the portion of the substrate contacted by the precursor gas. The second regions may be embedded with the first regions, or vice versa.

It will be appreciated that, optionally, along the substrate portion contacted by the precursor gas, alternatingly the portion of the substrate contacted by the plasma is present. In this way the portion of the substrate contacted by the precursor gas may selectively, e.g. alternatingly or intermittently, overlap with a portion of the substrate contacted by the plasma. Hence, patterning the surface of the substrate may comprise generating alternating atomic layers structures or chemical vapour deposition structures on the portion of the substrate contacted by the precursor gas. Hence, along on imaginary line that crosses, and stays within, the portion of the substrate contacted by the precursor gas, alternatingly regions with and regions without an atomic layer or a chemical vapour deposition layer may be found.

Preferably, a dimension of the deposition cavity exceeds a dimension of the plasma. In this way, patterning may be enabled.

Preferably, the method comprises confining the injected precursor gas to the deposition cavity adjacent to the substrate surface. In this way contamination outside the deposition cavity may be substantially prevented.

The method includes the step of forming a gas-bearing layer by injecting, by means of a bearing-gas injector of the apparatus, a bearing gas between the apparatus and the substrate surface. However, when said step is omitted, still a valuable method is obtained. It has been shown experimentally that such a gas-bearing layer may offer a number of advantages. The gas-bearing layer (also referred to as gas bearing) may enable a relatively close approach of the atomic layer deposition device and the surface of the substrate. In use, a smallest distance between the deposition device and the surface of the substrate may be smaller than 100 micrometer, for example in a range from 5 to 25 micrometer. As a result of the close approach, a gap between the deposition device and the substrate surface outside the deposition cavity may effectively hinder leakage of the precursor gas away along the surface away from the deposition cavity. Preferably, the bearing-gas injector is separate from the precursor supply.

In an embodiment, patterning the substrate precedes depositing the atomic layer on the substrate so that the layer is deposited on the patterned substrate. By means of the plasma treatment, a difference in adhesion for the precursor gas material may be created. As a result, the precursor gas preferentially adheres on parts of the surface that are, or are not, treated by the plasma.

In an embodiment, injecting the precursor gas from the precursor supply into the deposition cavity for contacting the substrate surface precedes generating the plasma discharge near the substrate so that the plasma reacts precursor-gas material that is present on the substrate for forming the atomic layer on the substrate or for removing the precursor-gas material that is present on the substrate. This embodiment relates to another way in which the a plasma treatment can interact with the atomic layer deposition process, for obtaining the patterned atomic layer. Optionally, the plasma may by used to locally react the precursor gas material to obtain the patterned atomic layer. Optionally, the plasma may be used to locally remove parts of a previously obtained atomic layer.

In an embodiment, the method comprises selectively generating the plasma discharge by positioning the first electrode with respect to the second electrode in a first position in which a distance between the first electrode, e.g. a first discharge portion of the first electrode, and the second electrode, e.g. a second discharge portion of the second electrode, is sufficiently small to support the plasma discharge at the high voltage difference, and selectively extinguishing the plasma discharge by positioning the first electrode with respect to the second electrode in a second position in which the distance between the first electrode and the second electrode is sufficiently large to prevent plasma discharge at the high voltage difference. Such a way of positioning the first electrode may be realised by using a conventional matrix printer head and/or a hammerbank printer head. It may be clear however that the plasma can be generated selectively in other ways as well.

Preferably, positioning the first electrode with respect tot the second electrode is carried out by means of an electrode positioner that comprises a piezo-electric actuator that is mechanically coupled to the first electrode. By means of the piezo-electric actuator, a relatively high precision in positioning the first electrode can be reached. This combines well with the gas bearing layer. The gas-bearing layer may e.g. typically have a variation in the distance between the substrate and the bearing-gas injector of a few, e.g. 5, micrometers. The piezo-electric actuator may have a precision that is within that variation. The piezo-electric actuator may be arranged for, in use, realising a displacement of the first electrode that is in a range from 0.6 mm to 1.2 mm.

In an embodiment, the method comprises moving the first electrode in a direction towards the second electrode when moving the first electrode into the first position and moving the first electrode in a direction away from the second electrode when moving the first electrode into the second position.

In an embodiment, the method comprises scanning the first electrode along the surface of the substrate.

In an embodiment, the method comprises simultaneously positioning a plurality of first electrodes with respect to the substrate and individually positioning each first electrode with respect to the second electrode.

In an embodiment, the method may comprise positioning the first electrode and second electrode in synchronism along the surface of the substrate. Such a way of positioning may be realised by using a conventional ink-jet head as the plasma device. Optionally, the electrode positioner is formed by the deposition positioner.

In an embodiment, the method comprises supplying a gas for forming the plasma therein toward the first electrode and/or the substrate, and/or comprising draining a gas away from the first electrode and/or the substrate.

In an embodiment, the method comprises arranging an intermediate structure in between the first electrode and the substrate.

The method optionally further comprises selectively etching the surface by means of the plasma discharge, selectively depositing a material onto the surface by means of the plasma discharge, e.g. by means of the intermediate structure, and/or selectively changing a property of the surface, e.g. changing it from hydrophobic to hydrophilic, by means of the plasma discharge.

Preferably, the method is carried out by means of an apparatus according to the invention.

It is an object of the invention to provide an improved apparatus for depositing a layer, such as an atomic layer of a chemical vapour deposition layer, on a surface of a substrate.

Thereto the invention provides an apparatus comprising a deposition device for layer deposition, such as atomic layer deposition or chemical vapour deposition, on a surface of a substrate, the deposition device comprising a precursor supply, a precursor drain, and a deposition cavity that in use is bounded by the deposition device and the substrate surface, wherein the deposition device is arranged for injecting a precursor gas from the precursor supply into the deposition cavity for contacting the substrate surface, and is arranged for draining at least part of the injected precursor gas through the precursor drain from the deposition cavity, wherein the deposition device comprises a deposition positioner arranged for positioning of the deposition cavity and the substrate relative to each other along a plane of the substrate surface, the apparatus further comprising a plasma device having a first electrode, a second electrode, and a high-voltage source, the plasma device further having an electrode positioner for relative positioning of the first electrode and the substrate, the plasma device being arranged for, preferably repeatedly, generating a plasma discharge near the substrate for contacting the substrate surface by generating a voltage difference between the first electrode and the second electrode by means of the high-voltage source, wherein the apparatus is provided with an apparatus controller that is coupled to the high-voltage source and/or the electrode positioner for generating the plasma discharge selectively, e.g. intermittently, in time and/or position, for patterning the surface of the substrate by means of the plasma so that a portion of the substrate contacted by the precursor gas selectively, e.g. intermittently, overlaps with a portion of the substrate contacted by the plasma, the apparatus further comprising a bearing gas injector arranged for injecting a bearing gas between the apparatus and the substrate surface, the bearing gas thus in use forming a gas bearing.

The apparatus may enable a combined process of, on the one hand, patterning the surface by means of the plasma discharge, and, on the other hand, layer deposition. As a result, patterned layers may be obtained, as a plasma treatment can interact with the layer deposition process. For example, the plasma can be used to react precursor gas material that is present on the substrate into an atomic layer. When using a known apparatus, obtaining a patterned layer would require additional process steps (e.g. lithography) to be carried out on a layer obtained after blanket deposition.

The apparatus comprises a bearing gas injector arranged for injecting a bearing gas between the apparatus and the substrate surface, the bearing gas thus forming a gas bearing. By means of the gas bearing, the deposition positioner is further arranged for relative positioning of the precursor supply and the substrate out of the plane of the substrate surface. In this way, in use the apparatus, or an apparatus head comprised by the apparatus, may float on the substrate. The bearing-gas injector may be separate from the precursor supply. Having such a separate injector for the bearing gas enables control of a pressure in the gas-bearing layer separate from other gas pressures, for example the precursor gas pressure in the deposition cavity. For example, in use the precursor gas pressure can be lower than the pressure in the gas-bearing layer. In this way process conditions can be further optimized.

Preferably, along the substrate and transverse to the direction of relative motion realised by the deposition positioner, a dimension of the deposition cavity exceeds a dimension of the plasma.

Preferably, the atomic layer deposition device is provided with a confining structure arranged for confining the injected precursor gas to the deposition cavity adjacent to the substrate surface. The gas bearing may form the confining structure.

Preferably, the controlling comprises controlling a moment and a position on which the generation of the voltage difference takes place.

In an embodiment, the apparatus may be arranged for applying a prestressing force on the atomic layer deposition device directed towards the substrate surface. The apparatus may be further be arranged for counteracting the prestressing force by controlling the pressure in the gas-bearing layer. In use, the prestressing force increases a stiffness of the gas bearing. Such an increased stiffness reduces unwanted movement out of the plane of the substrate surface. As a result, the deposition device can be operated more closely to the substrate surface, without touching the substrate surface.

In an embodiment, the electrode positioner is arranged for selectively positioning the first electrode with respect to the second electrode in a first position in which a distance between the first electrode, e.g. a first discharge portion of the first electrode, and the second electrode, e.g. a second discharge portion of the second electrode, is sufficiently small to support the plasma discharge at the high voltage difference, and in a second position in which the distance between the first electrode and the second electrode is sufficiently large to prevent plasma discharge at the high voltage difference. This forms a convenient way to selectively, e.g. locally, generate the plasma.

In an embodiment, the electrode positioner is arranged for moving the first electrode in a direction towards and away from the second electrode.

In an embodiment, the second electrode is designed as a drum on the outer surface of which a sheet-shaped substrate can be placed in between the drum and the first electrode, while the electrode positioner is arranged for moving the first electrode in a direction normal to the outer surface.

In an embodiment, the electrode positioner is further arranged for positioning the first electrode along the surface of the substrate.

In an embodiment, the plasma device comprises a housing, wherein the first electrode is at least partially surrounded by the housing, and the first electrode is movable with respect to the housing.

In an embodiment, the high voltage source is arranged for adjusting, preferably by means of the apparatus controller, the high voltage difference between the first and the second electrode.

In an embodiment, the plasma device comprises a plurality of first electrodes and/or a plurality of second electrodes. Preferably, the electrode positioner is arranged for individually positioning each first electrode with respect to the one or more second electrodes. Preferably, the electrode positioner is arranged for individually positioning each first electrode with respect to the remaining first electrodes.

In an embodiment, the first electrode is formed by a movable pen of a print head of a matrix printer, electrically conducting connected to the high voltage source.

In an embodiment, the first electrode and/or the second electrode is nano-structured or micro-structured, for instance by means of laser deposition or ablation at the discharge portion, dedicated crystal growth at the discharge portion or by providing carbon nanotubes at the discharge portion.

In an embodiment, the electrode positioner is further arranged for positioning the second electrode in synchronism with the first electrode.

In an embodiment, the electrode positioner comprises a piezo-electric actuator that is mechanically coupled to the first electrode for positioning the first electrode with respect to the substrate. By means of the piezo-electric actuator, a relatively high precision in positioning the first electrode can be reached. It will be appreciated that it is also possible that the first electrode is formed by a piezo-electric actuator, optionally provided with an additional electrically conducting coating on at least a portion of the outer surface thereof, e.g. at or near the discharge portion of the first electrode.

In an embodiment, the first and second electrode are coupled mechanically.

In an embodiment, the high voltage source and/or the apparatus controller is arranged to in a first mode selectively generate the high voltage difference to support the plasma discharge, and in a second mode generate a decreased voltage difference or zero voltage difference to prevent plasma discharge.

In an embodiment, the plasma device comprises a plurality of first electrodes and a plurality of second electrodes, wherein the high voltage source and/or the apparatus controller is arranged for selectively applying the high voltage between at least one first electrode and at least one second electrode.

In an embodiment, the plasma device is provided with a plasma-gas supply for supplying a gas for forming the plasma therein toward the first electrode and/or the substrate, and/or provided with a plasma-gas drain for draining a gas away from the first electrode and/or the substrate.

In an embodiment, the first electrode is provided with the gas-supply arranged for supplying therethrough a gas for forming the plasma.

In an embodiment, the first electrode is formed by a hollow pen.

In an embodiment, the first electrode is formed by a printing tip of a hammerbank that is preferably comprised by a hammerbank printer.

In an embodiment, the plasma device is further provided with an intermediate structure that is, in use, arranged in between the first electrode and the substrate. Preferably, the intermediate structure allows for positioning the first electrode with respect to the substrate. By means of the intermediate structure, the generated plasma can be utilized more beneficially and/or can be used to enable an additional functionality. Preferably, the intermediate structure is a sheet such as a plate.

Positioning the first electrode and the substrate relative to each other may comprise moving the first electrode towards and/or along the substrate. Positioning the first electrode may be allowed by having an open space between the intermediate structure and the substrate and/or between the intermediate structure and the first electrode. Optionally, the intermediate structure is mechanically coupled to the first electrode so that it moves along the substrate together with the first electrode.

In an embodiment, the intermediate structure is formed as a sheet provided with at least one aperture, preferably a plurality of apertures, for providing therethrough the plasma. Optionally, such apertures may have a maximum dimension, such as a maximum diameter, that is smaller than a minimum distance between the first electrode and the substrate. As the plasma may reach the substrate through the apertures, the apertures can influence a size of an area of the substrate that is treated by the plasma. By tuning dimensions of the apertures, the intermediate structure can be utilized to reduce a spot size or track width of a pattern generated by the plasma. In this way, a resolution of the pattern can be improved. The maximum dimension of at least one, optionally all, of the apertures may e.g. be 10 micrometer or 20 micrometer. Hence, the at least one, optionally all, of the apertures may e.g. have a diameter of at most 10 micrometer or at most 20 micrometer. The apertures may e.g. be beneficially employed by providing a gas therethrough for forming the plasma. In this way the gas flow can be focussed. The gas can be used more economically. This embodiment may have the additional advantage that the first electrodes can be cooled by the gas flow through the apertures.

In an embodiment, the intermediate structure comprises, and preferably essentially consists of, an electrically non-conductive material. In this way the electric field generated by the high-voltage source can be concentrated through the apertures. In this way the size of the area of the substrate that is treated by the plasma can be effectively reduced. That is, the aperture may be used as a diaphragm for effectively reducing the size of the plasma at the substrate. The intermediate structure may be positioned in between the first and the second electrodes.

In an embodiment, the intermediate structure may comprise, and preferably essentially consists of, an electrically conductive material that may form the second electrode. In this way it is possible that the substrate need not be positioned in between the first and second electrode. Exposing the substrate to the electric field generated by the high-voltage source may thus be substantially prevented. This may be important if the substrate is relative thick. Then, placing the substrate in between the first and second electrode would require a relatively high electric field for generating a plasma. This may also be important if the substrate is provided with relatively vulnerable components like integrated circuits, which can be damaged by strong electric fields. It will be appreciated that the intermediate structure may be segmented. The intermediate structure may comprise separate segments, each corresponding to an associated first electrode. This allows for the segments to be switched relative to the high-voltage source, so as to switch the plasma on and off.

Preferably, the first electrode and/or the second electrode, e.g. the electrically conductive material, may be provided with an electrically insulating cover. In this way, spark formation between the first and second electrode may be hindered and may even be prevented.

In an embodiment, the intermediate structure is formed as a sheet, such as a ribbon, that comprises a process material, such as a precursor or depositable material, that is at least partly releasable by means of the plasma. By means of the intermediate structure, the generated plasma can be utilized to enable processing, e.g. deposition, of the at least part of the process material, e.g. the depositable material. In this way an additional functionality of the device can be provided.

The process material may optionally be used as precursor material or reactant material in an atomic layer deposition process, or as precursor material in a chemical vapour deposition process. Then, injecting the precursor gas from the precursor supply into the deposition cavity for contacting the substrate surface may be performed by releasing the process material by means of the plasma.

In an embodiment, the intermediate structure comprises a carrier sheet provided with the process material, wherein the process material is at least partly removable from the carrier sheet by means of the plasma. By means of the intermediate structure, the generated plasma can be utilized to enable processing, e.g. deposition, of the process material held by the carrier sheet. Preferably, in use the process material is arranged in between the carrier sheet and the substrate. However, this is not necessary. Optionally, the carrier-sheet may, e.g. at least partly, be mesh-shaped. Then, the process material may be provided within openings of the mesh. The process material may e.g. be impregnated in the mesh-shaped carrier.

The apparatus according to the invention may optionally be used for treating the surface of an electrically insulating substrate, such as a plastic object, e.g. a sheet of plastic. The device according to the invention may optionally be used for treating the surface of a semiconducting or conducting substrates. When using the (semi-)conducting substrate, the first and/or second electrodes are preferably covered, e.g. coated, with electrically insulating material as described above. It will be appreciated that the electrically conducting substrate may also be used as the second electrode.

Preferably, the apparatus is used for carrying out a method according to the invention.

It is another object of the invention to provide an improved method of manufacturing a meso-scale electronics device.

Thereto the invention provides a method for manufacturing a light-emitting diode from a stack of, preferably patterned, atomic layers, or for manufacturing a meso-scale electronics device, such as an (O)LED device, an RFID tag or a solar-cell device; a meso-scale three dimensional structure, such as a MEMS device, a micro-lens or a multi-focus lens; a lab-on-chip; a biochip; a printable plastics object or an offset printing plate from a substrate, by depositing at least one, preferably patterned, atomic layer by means of an apparatus according to the invention and/or a method according to the invention.

The invention will be described by, non-limiting, examples in reference to the accompanying drawing, wherein:

FIG. 1 schematically shows an apparatus in a first embodiment according to the invention;

Figure 1:
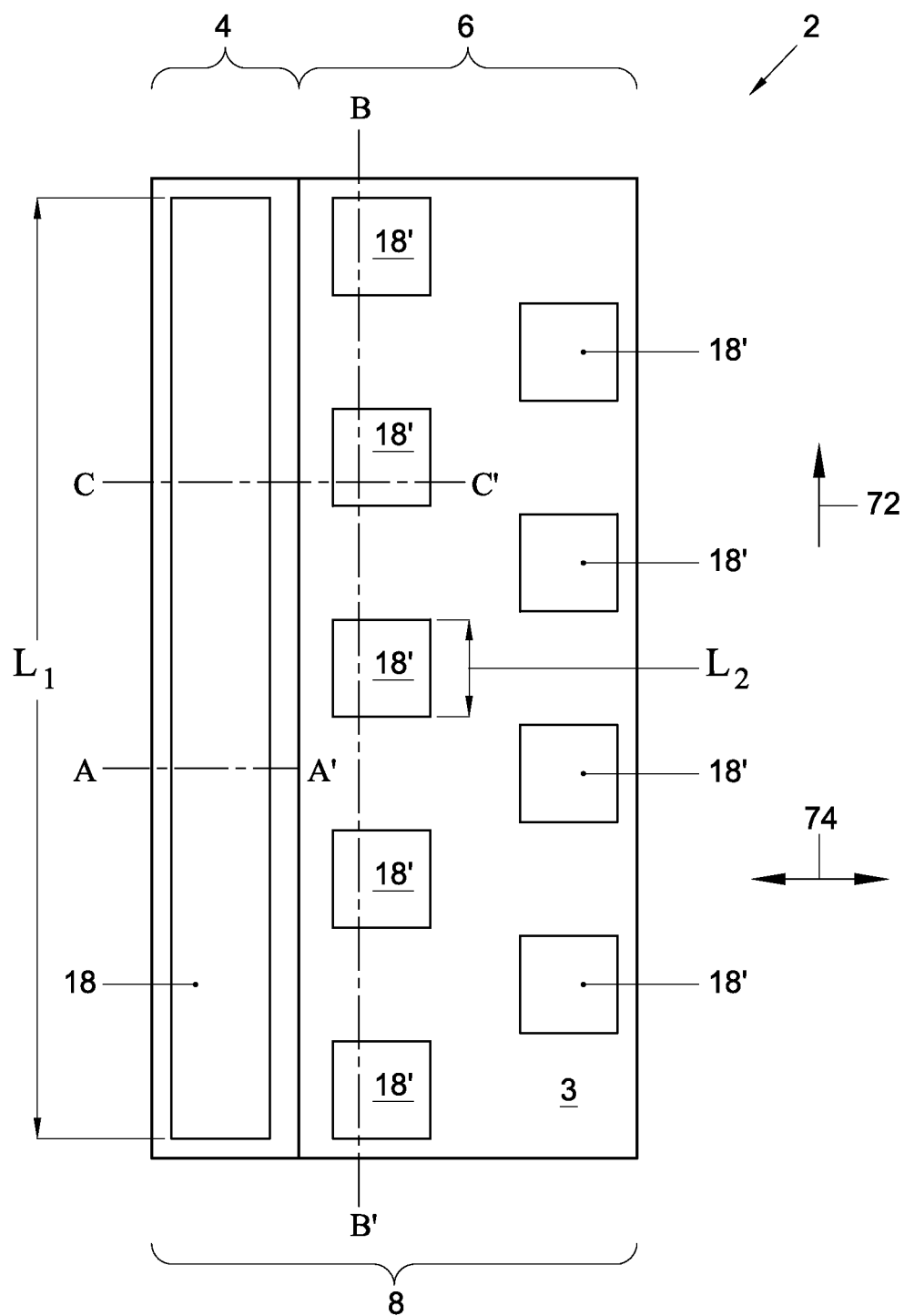
Figure 3A:
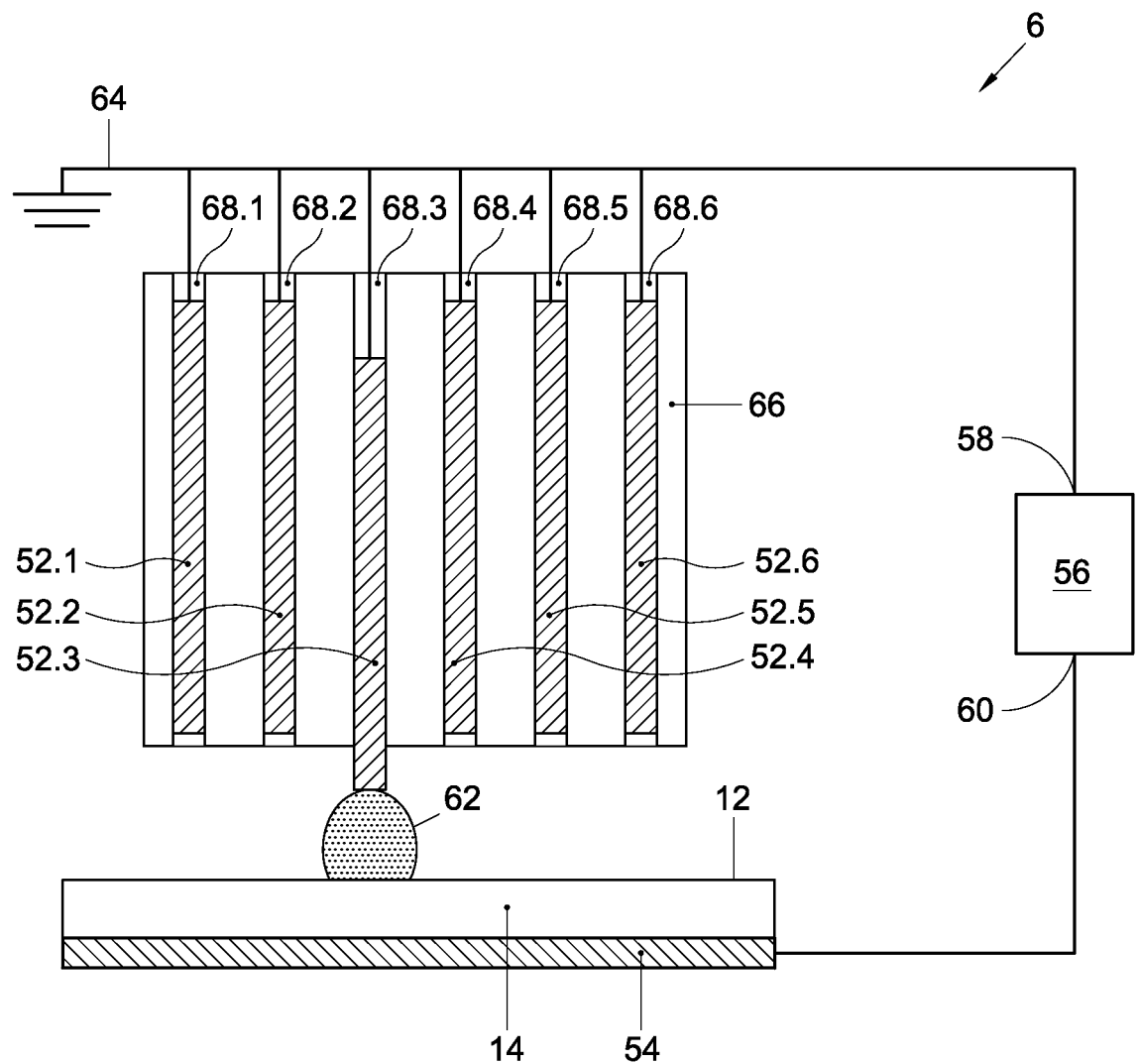
FIG. 3A shows an embodiment of a plasma device in a cross section B-B' shown in FIG. 1.
Figure 3B:
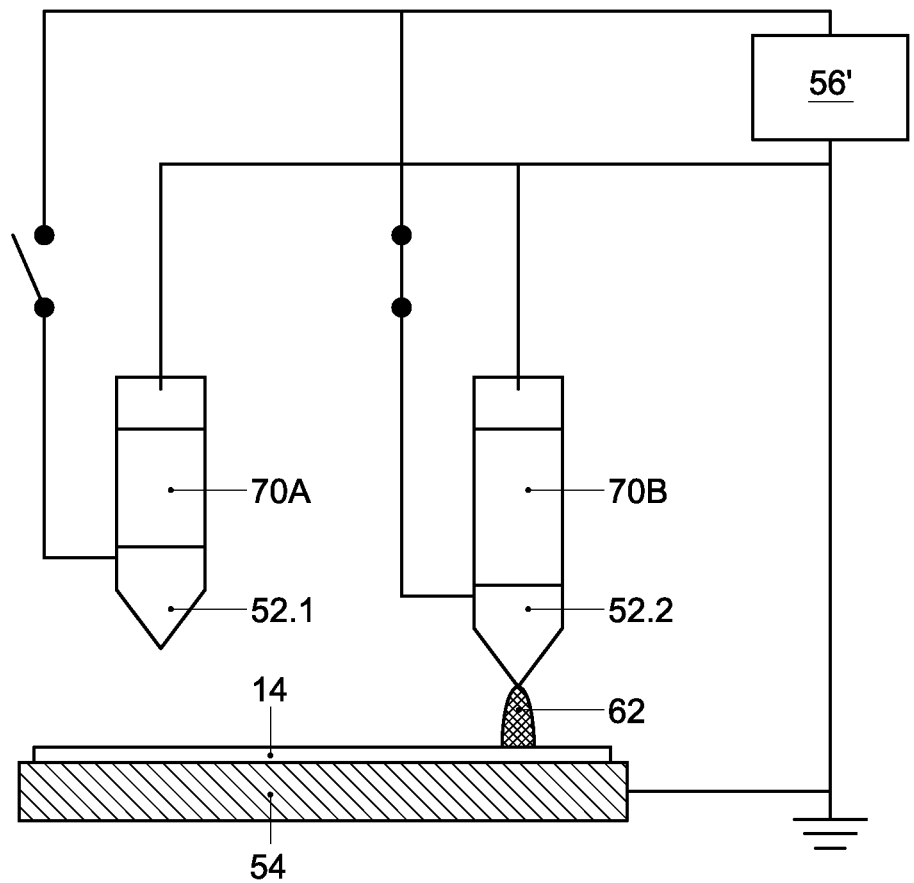
Figure 3C:
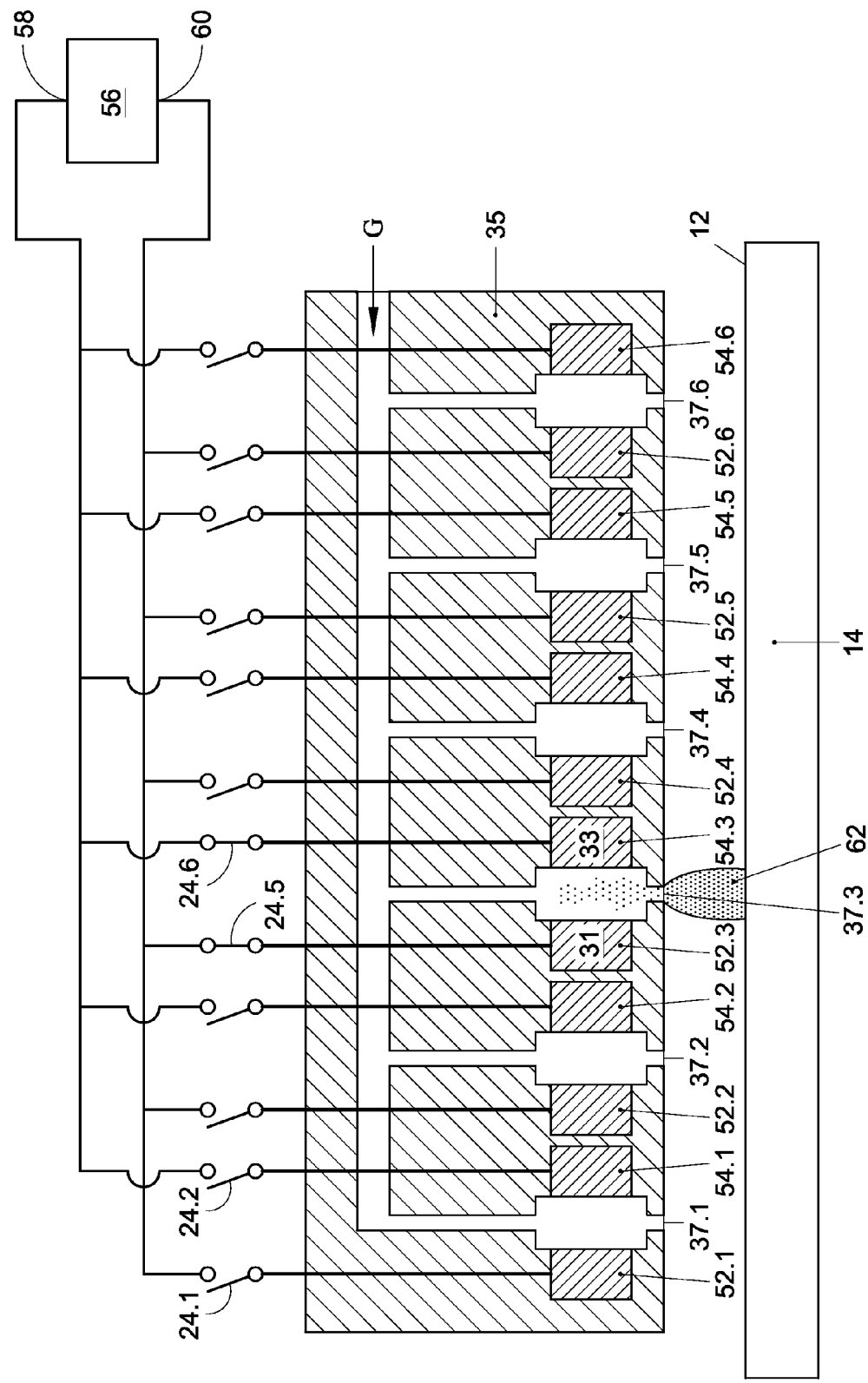
Figure 3D:
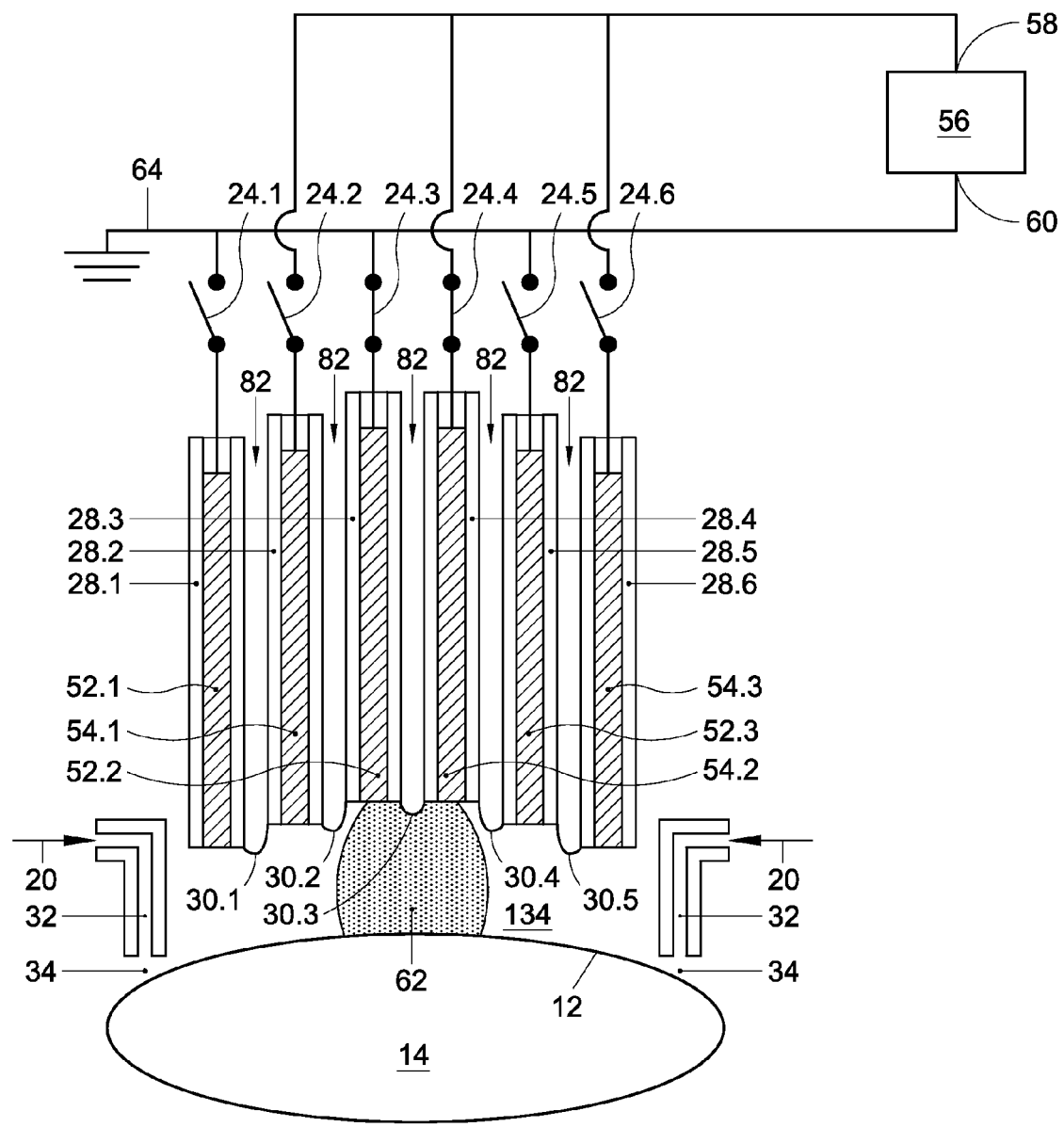
Figure 3E:
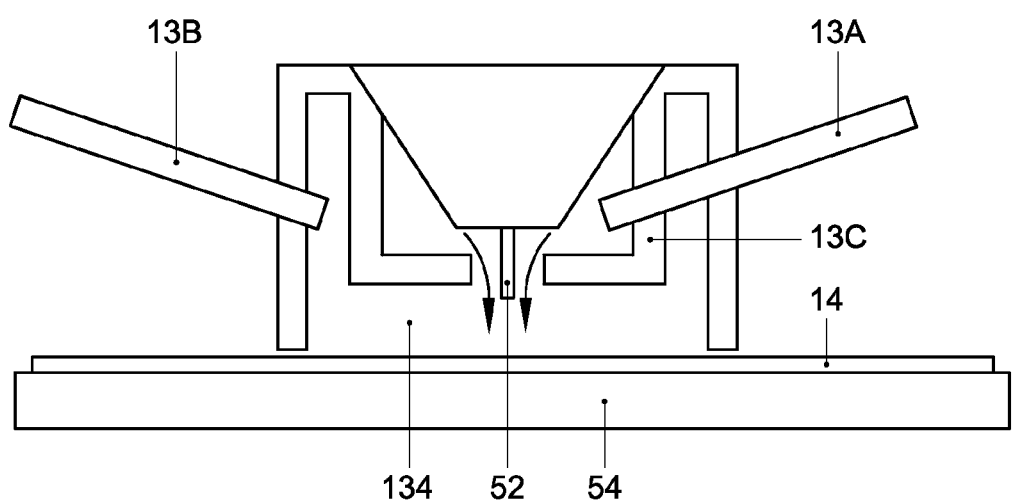
Figure 3F:
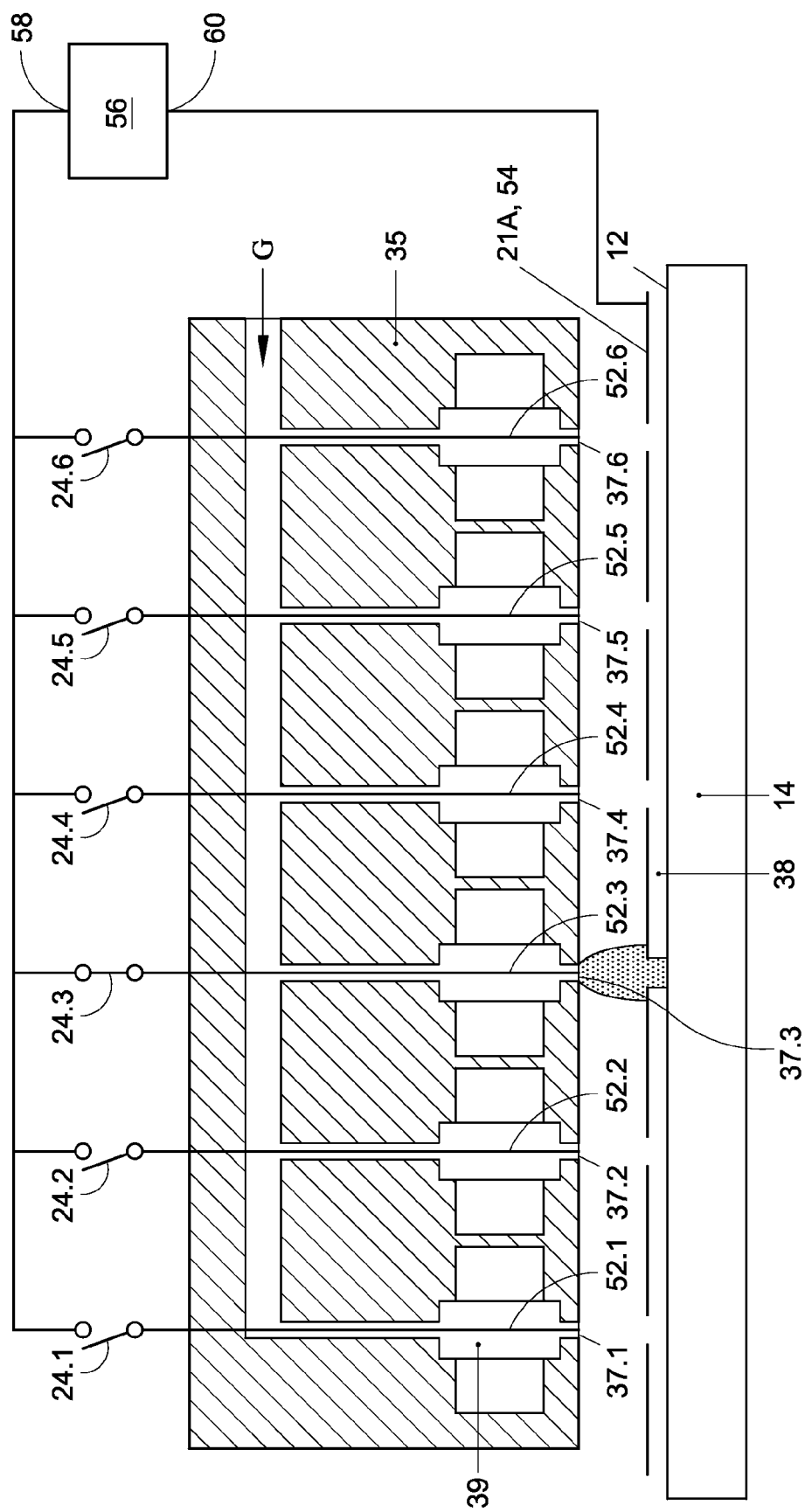
Figure 4:
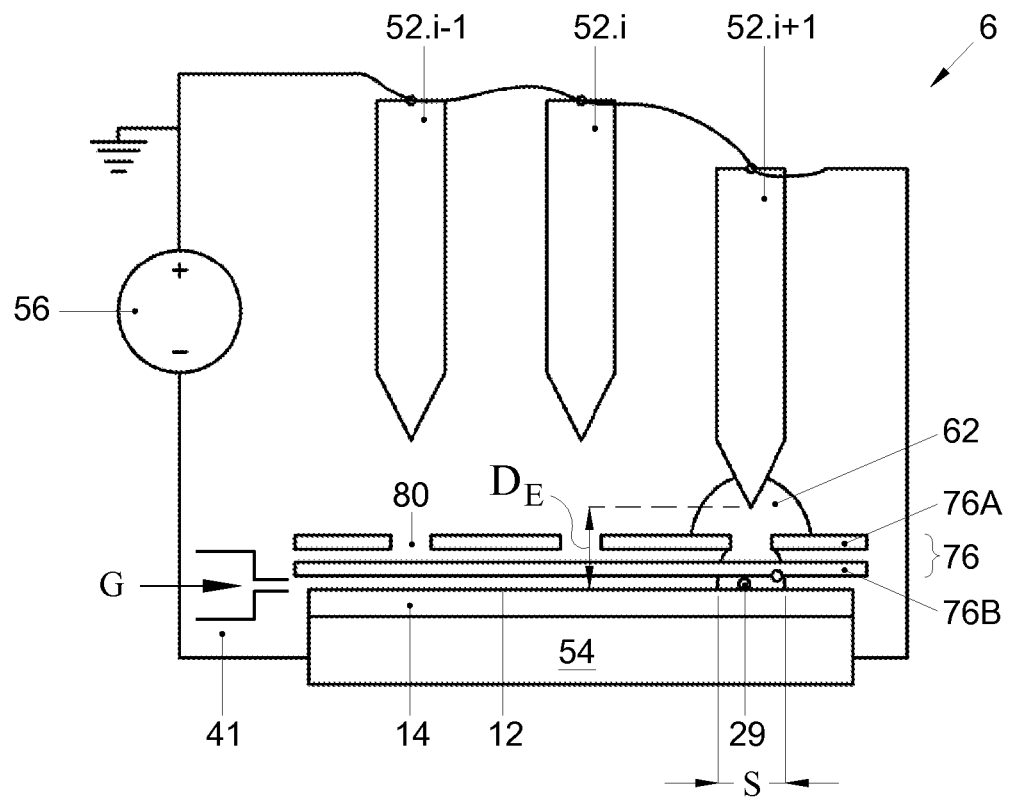
Figure 4A:
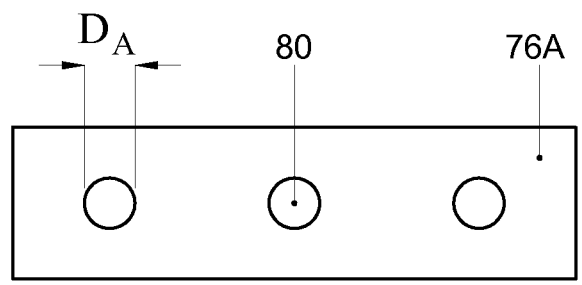
Figure 5:
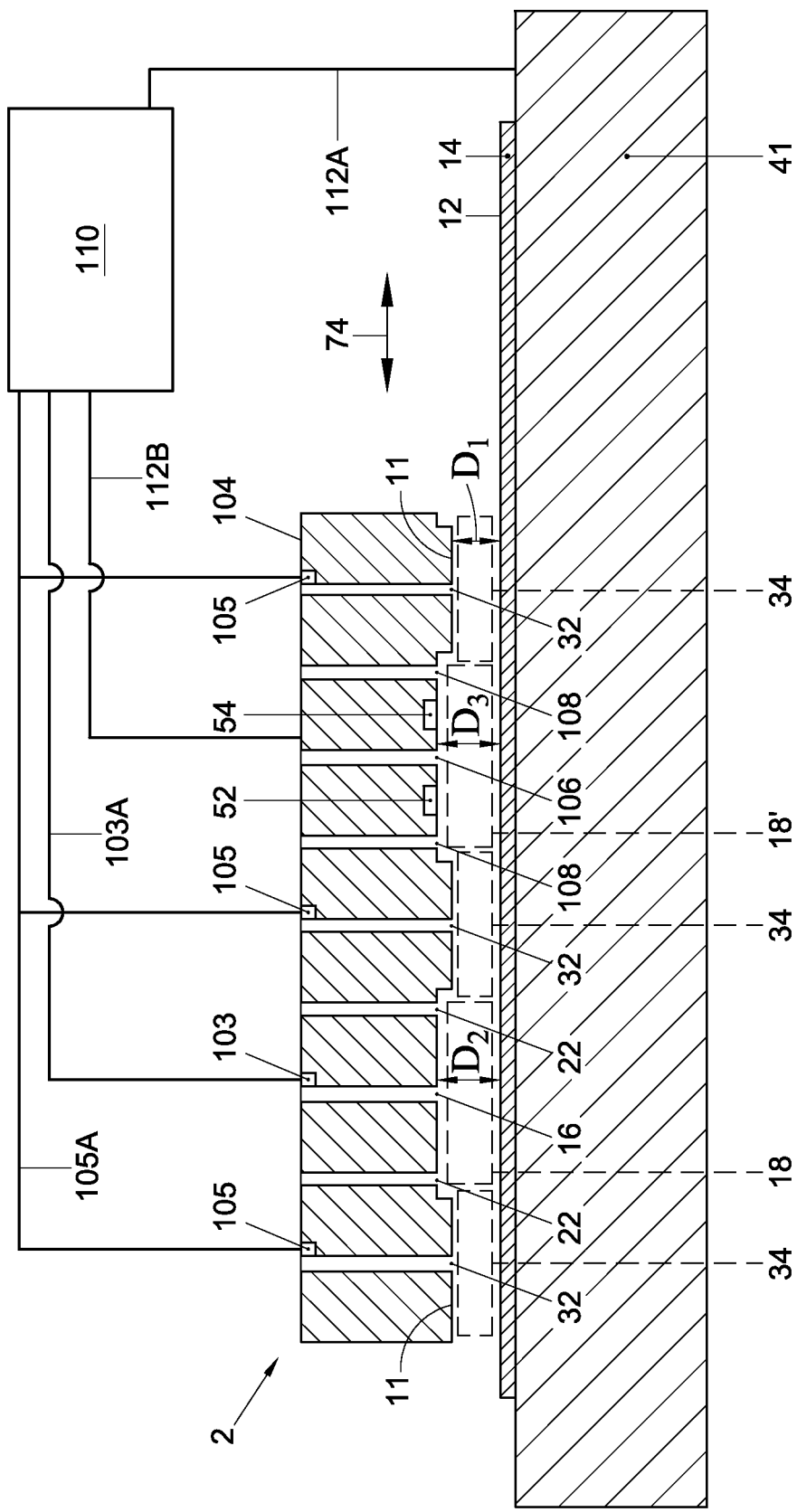

FIG. 3B schematically shows how a piezoelectric actuator can be used in a plasma device or in a method according to the invention;

FIG. 3C shows another embodiment of a plasma device;

FIG. 3D shows a further embodiment of the plasma device;

FIG. 3E schematically shows how the gas can be entered into a discharge space;

FIG. 3F shows a yet further embodiment of a plasma device;

FIG. 4 shows an example of a plasma device having an intermediate structure;

FIG. 4A shows a pinhole plate in a top view;

FIG. 5 shows an example of an apparatus in a cross section C-C' shown in FIG. 1;

FIG. 5A shows an example wherein the first electrode 52.2 is formed by a hollow needle;

FIG. 5B shows a bottom view of a further deposition cavity provided with a plurality of first electrodes and a plurality of second electrodes; and FIG. 5C shows a detail of FIG. 5B Unless stated otherwise, the same reference numbers refer to like components throughout the drawings.

FIG. 1 schematically shows an apparatus 2 in a first embodiment according to the invention. FIG. 2 shows a view of an outlet face of the apparatus. The apparatus comprises a deposition device 4 for atomic layer deposition or chemical vapour deposition on a surface of a substrate. The apparatus further comprises a plasma device 6 for generating a plasma discharge near the substrate for patterning the surface of the substrate. The deposition device 4 and the plasma device 6 may be integrated to include one apparatus head. However, alternatively, they may for example include distinct heads, i.e. a deposition head respectively a plasma head, that can be operated independently from each other. The deposition head may be an atomic layer deposition (ALD) head or a chemical vapour deposition (CVD) head.

In general, the apparatus 2 may be arranged for providing a precursor gas and a plasma in respectively a deposition cavity and a further deposition cavity that are mutually separated. These deposition cavities are schematically indicated in FIG. 1 with reference number 18 and 18'. It may be clear that, in general, the apparatus may have a plurality of deposition cavities 18 and/or a plurality of further deposition cavities 18'. Each further deposition cavity may be associated with an individual first electrode. However, as described with reference to FIGS. 5A and 5B, a plurality of first electrodes may be associated with, e.g. positioned in, each further deposition cavity 18'. As another variation of the apparatus in the first embodiment, the plurality of further deposition cavities 18' may be merged together into one, two, or more further deposition cavities 18'. Then, in general, the apparatus 2 and/or the plasma device 6 may be provided with at least one further deposition cavity wherein a dimension $L_2$ of the further deposition cavity is similar to a dimension $L_1$ of the deposition cavity 18. The further deposition cavity may than be provided with a plurality of first electrodes and optionally a plurality of second electrodes (FIG. 5B).

In the further deposition cavity, the deposited precursor gas material may be reacted to obtain the atomic layer or the chemical vapour deposition layer. In this way for example plasma-enhanced atomic layer deposition or plasma-enhance chemical vapour deposition may be enabled. Plasma-enhanced atomic layer deposition is especially suitable for deposition of low-k Aluminum Oxide ($Al_2O_3$) layers of high quality, for example for manufacturing semiconductor products such as chips (integrated circuits) and solar cells.

In atomic layer deposition, the precursor gas can for example contain Hafnium Chloride ($HfCl_4$), but can also contain another type of precursor material, for example Tetrakis-(Ethyl-Methyl-Amino) Hafnium or trimethylaluminium ($Al(CH_3)_3$). The precursor gas can be injected together with a carrier gas, such as nitrogen gas or argon gas. A concentration of the precursor gas in the carrier gas may typically be in a range from 0.01 to 1 volume %. In use, a precursor gas pressure in the deposition cavity may typically be in a range from 0.1 to 1 millibar, but can also be near atmospheric pressure, or even be significantly above atmospheric pressure. The apparatus may be provided with a heater for establishing an elevated temperature in the further deposition cavity 18', although this is not necessary as the plasma may provide for sufficient heat for initiating and sustaining the reaction of the precursor gas material.

The apparatus 2 may be arranged for providing a reactant gas for atomic layer deposition in the further deposition cavity 18'. By means of the plasma, the reactant gas and the precursor gas material present on the substrate may be reacted into an atomic layer. The reactant gas contains for example an oxidizer gas such as Oxygen ($O_2$), ozone ($O_3$), and/or water ($H_2O$).

In FIG. 1 a dimension $L_1$ of the deposition cavity is indicated, as well as a dimension $L_2$ of the further deposition cavity that the plasma in use at least partly may fill. It may be clear from FIG. 1 that, along the substrate 14, in use the dimension of the deposition cavity $L_1$ exceeds the dimension $L_2$ of the further deposition cavity. More in general, the dimension $L_1$ of the deposition cavity and the dimension $L_2$ of the further deposition cavity may be measured in one and the same direction, for example a direction indicated by arrow 72 in FIG. 1. The direction in which $L_1$ and $L_2$ are measured may be transverse to a direction of relative motion between the deposition cavity and/or the first electrodes 52.$i$ on the one hand and the substrate on the other hand, which direction is indicated by double arrow 74 in FIG. 1.

The apparatus 2 may be provided with an apparatus controller that is arranged for generating the plasma discharge selectively in time and/or position. When relative motion between the apparatus 2 and a substrate is realised and a plasma is generated selectively in time and/or position, it may be clear that a patterned ALD layer or CVD layer may be obtained. As a result of the patterning by means of the plasma, a portion of the substrate contacted by the precursor gas selectively overlaps with a portion of the substrate contacted by the plasma.

Figure 1A:
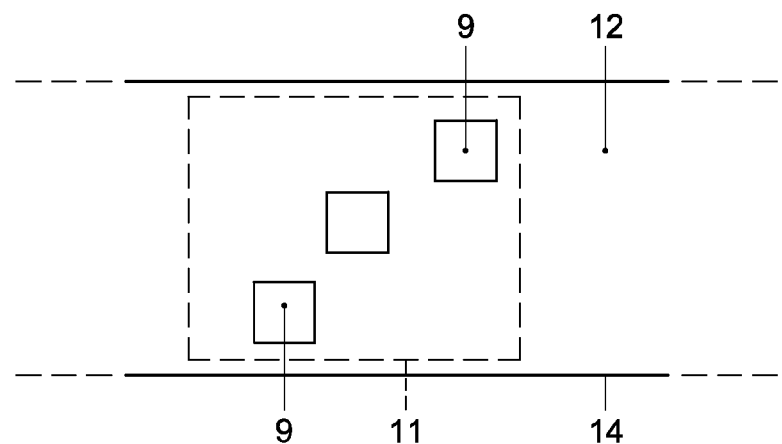
Figure 1B:
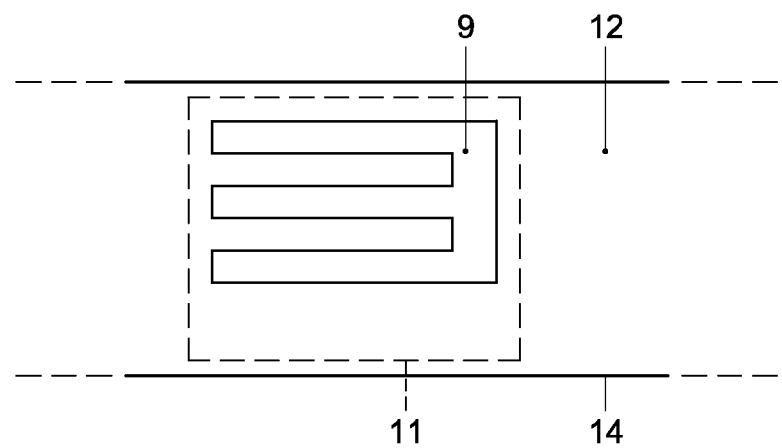
Figure 1C:
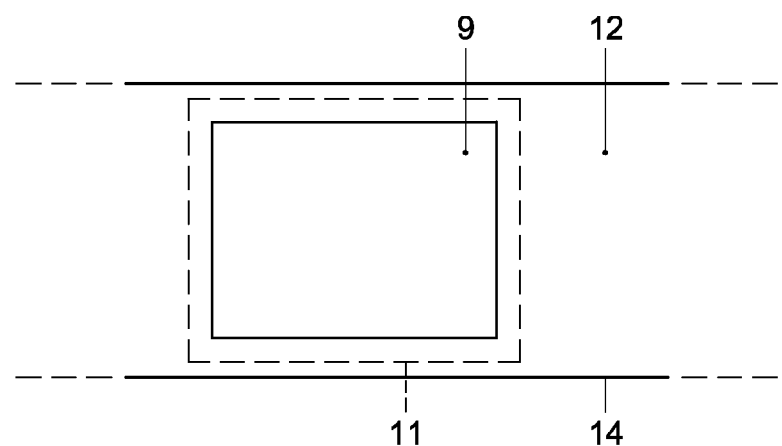

FIG. 1A shows an example of a pattern wherein individual islands of layers 9, i.e. atomic layers (also referred to as ALD layers) or CVD layers, are formed on the portion 11 of the substrate contacted by the precursor gas. FIG. 1B shows an example of a pattern wherein an ALD or CVD layer 9 having an interdigitated shape is formed. FIG. 1C shows an example wherein an ALD or CVD layer 9 is contained within the portion 11 of the substrate contacted by the precursor gas. Creating these layers 9 may comprise patterning the surface of the substrate by means of the plasma.

Figure 2A:
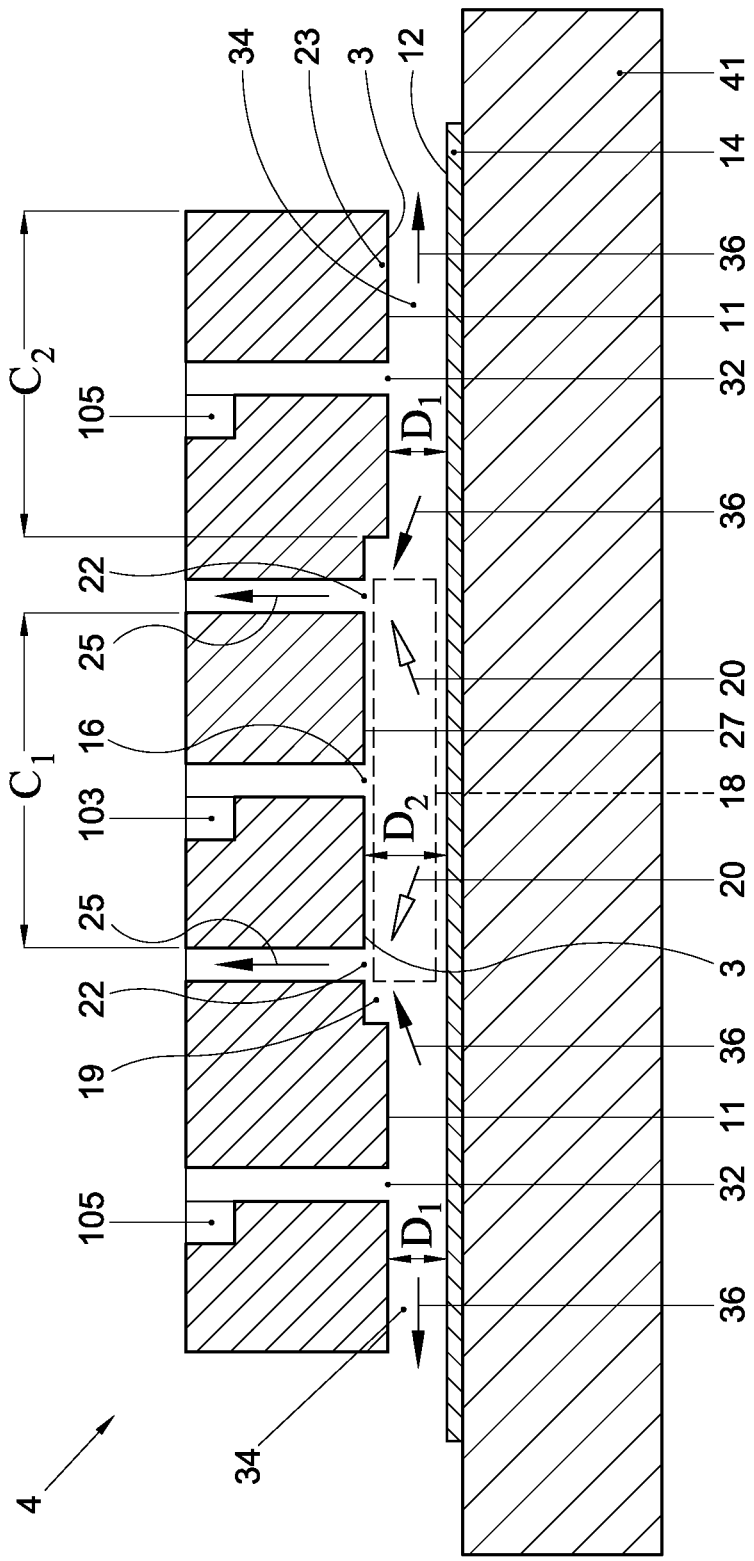
FIG. 2A shows an embodiment of a deposition device in a cross section A-A' shown in FIG. 1.

FIG. 2A shows an embodiment of the deposition device 4 in a cross section A-A' shown in FIG. 1. FIG. 2A further shows the surface 12 of the substrate 14. The deposition device 4 comprises a precursor supply 16. The deposition device may further comprise the deposition cavity 18 that in use may be bounded by the deposition device 4 and the surface 12. The deposition device 4 is arranged for injecting a precursor gas from the precursor supply 16 into the deposition cavity 18 for contacting the substrate surface 12. In this way, precursor gas molecules may hit the substrate surface 12 and may attach to the substrate surface 12. Flow of the precursor gas in this example is indicated with arrows 20.

The deposition device 4 further comprises a precursor drain 22. The deposition device 4 is arranged for draining at least part of the injected precursor gas through the precursor drain 22 out of the deposition cavity 18. Flow of drained injected precursor gas in this example is indicated by arrows 25.

The deposition device 4 comprises a deposition positioner arranged for relative positioning of the deposition cavity and the substrate along a plane of the substrate surface. Various variants of the deposition positioner are possible. For example, the deposition positioner may comprises a moveable substrate table 41. Alternatively, the deposition positioner may comprise a rotatable drum along which the substrate may be guided. Alternatively or additionally, the deposition positioner may comprise a transporter for moving the deposition device. It may thus be clear that positioning of the precursor supply and the substrate relative to each other may comprise moving the precursor supply and/or the substrate.

The deposition positioner may further be arranged for relative positioning of the precursor supply and the substrate out of the plane of the substrate surface. This may be achieved for example by providing the deposition device 4 with a bearing gas injector 32. The bearing gas injector 32 is arranged for injecting a bearing gas between the deposition device and the substrate surface. In use, the bearing gas may form a gas-bearing layer 34. Flow of the bearing gas is indicated by arrows 36. The precursor drains 22 may be used for draining the bearing gas as well. The bearing-gas injectors 32 however are separate from the precursor supply 16. The injected bearing gas may at the same time provide a confining structure, i.e. a gas curtain, for confining the injected precursor gas to the deposition cavity.

More in general, the gas bearing in use typically shows a strong increase of the pressure in the gas-bearing layer as a result of the close approach of the deposition device 4 towards the substrate surface. For example, in use the pressure in the gas-bearing layer at least doubles, for example typically increases eight times, when the deposition device moves two times closer to the substrate, for example from a position of 50 micrometer from the substrate surface to a position of 25 micrometer from the substrate surface, ceteris paribus. Preferably, a stiffness of the gas bearing in use is between $10^3$ and $10^{10}$ Newton per millimeter, but can also be outside this range. Such a stiffness may be realised by applying a pre-stressing force on the gas bearing. In general, the bearing gas injector 32 may be provided with a flow restriction provided in a flow channel of the bearing gas injector, for providing the stiffness of the gas bearing.

The deposition device of FIG. 2A may have gas controllers 105 for controlling injection of the bearing gas. The deposition device of FIG. 2A may have a gas controller 103 for controlling injection of the precursor gas. These gas controllers may be comprised by the apparatus controller.

Figure 2B:
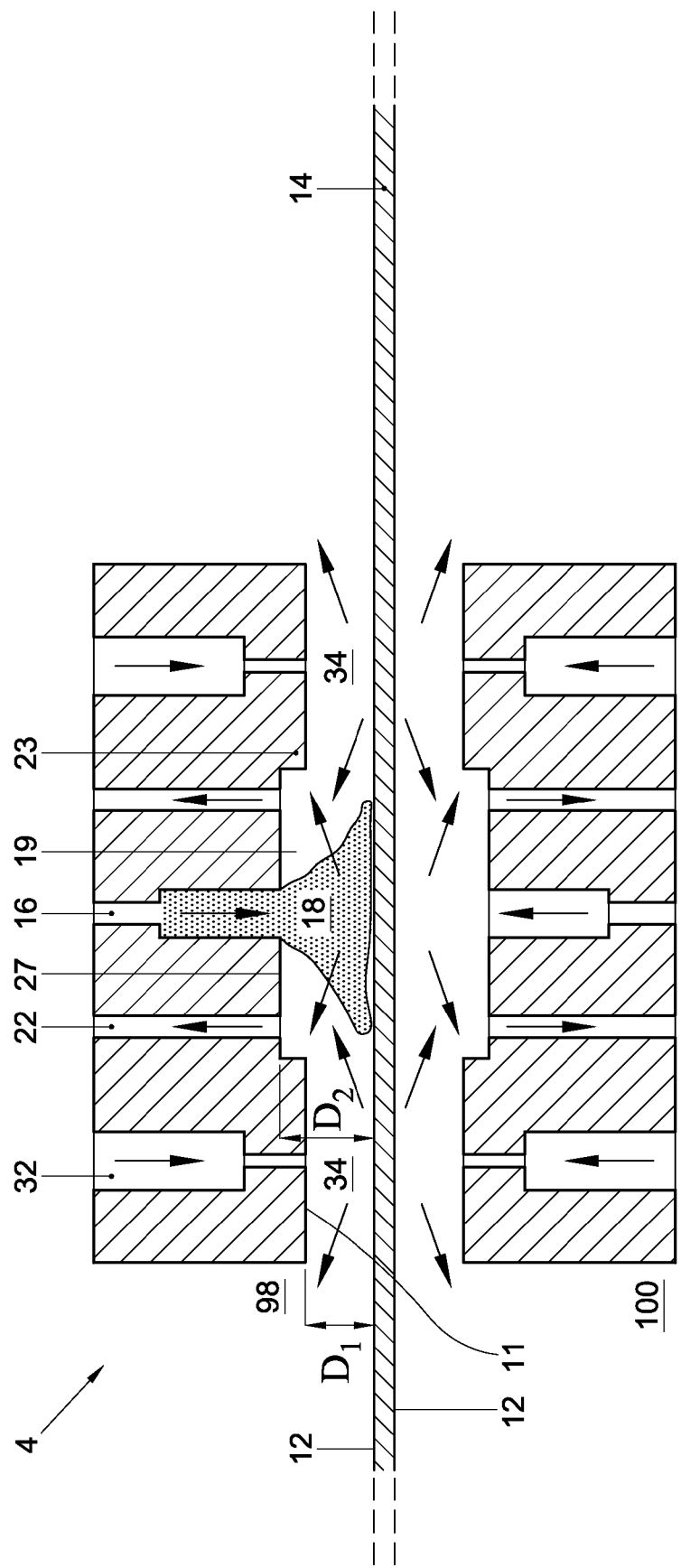
FIG. 2B shows another embodiment of a deposition device.

FIG. 2B shows another embodiment of the deposition device 4. According to an aspect of the invention, the invention may provide the deposition device 4 comprising the deposition head 98 comprising the deposition cavity 18 provided with the precursor supply 16 and the precursor drain 22. Said supply and drain may be arranged for providing a precursor gas flow from the precursor supply via, preferably only, the deposition cavity to the precursor drain. The deposition cavity 18 may in use be bounded by the deposition head and the substrate surface 12. The deposition device 4 may comprise a gas bearing comprising a bearing gas injector 32, arranged for injecting a bearing gas between the deposition head 98 and the substrate surface, the bearing gas thus forming a gas-bearing (layer). The deposition device 4 may comprise a conveying system, being an example of the deposition positioner, providing relative motion of the substrate and the deposition head along a plane of the substrate to form a conveying plane along which the substrate is conveyed. A support part 100 may be arranged opposite the deposition head, the support part constructed to provide a gas bearing pressure arrangement that balances the deposition head gas-bearing in the conveying plane, so that the substrate is held supportless by said gas bearing pressure arrangement in between the deposition head and the support part.

In the example of FIG. 2B, the support part 100 is provided that provides a support for substrate 14 along a conveying plane which may be seen as the center line of substrate 14. The support part 100 is arranged opposite the deposition head 98 and is constructed to provide a gas bearing pressure arrangement that balances the deposition head gas-bearing 34 in the conveying plane. Although less then perfect symmetrical arrangements may be feasible to provide the effect, preferably, the balancing is provided by having an identical flow arrangement in the support part as is provided by the deposition head 98. Thus, preferably, each flow ejecting nozzle, e.g. the precursor supply 16 or the bearing-gas injector 32, of the support part 10 is symmetrically positioned towards a corresponding nozzle of the deposition head 98. In this way, the substrate can be held supportless, that is, without a mechanical support, by said gas bearing pressure arrangement in between the deposition head 98 and the support part 100 of the deposition device 4. By absence of any mechanical support, a risk of contamination of such support is prevented which is very effective in securing optimal working height of the deposition head 98 relative to the substrate 14. In addition, less down time of the system is necessary for cleaning purposes. Furthermore, importantly, by absence of a mechanical support, a heat capacity of the system can be reduced, resulting in faster heating response of substrates to production temperatures, which may significantly increase production throughput.

Figure 2C:
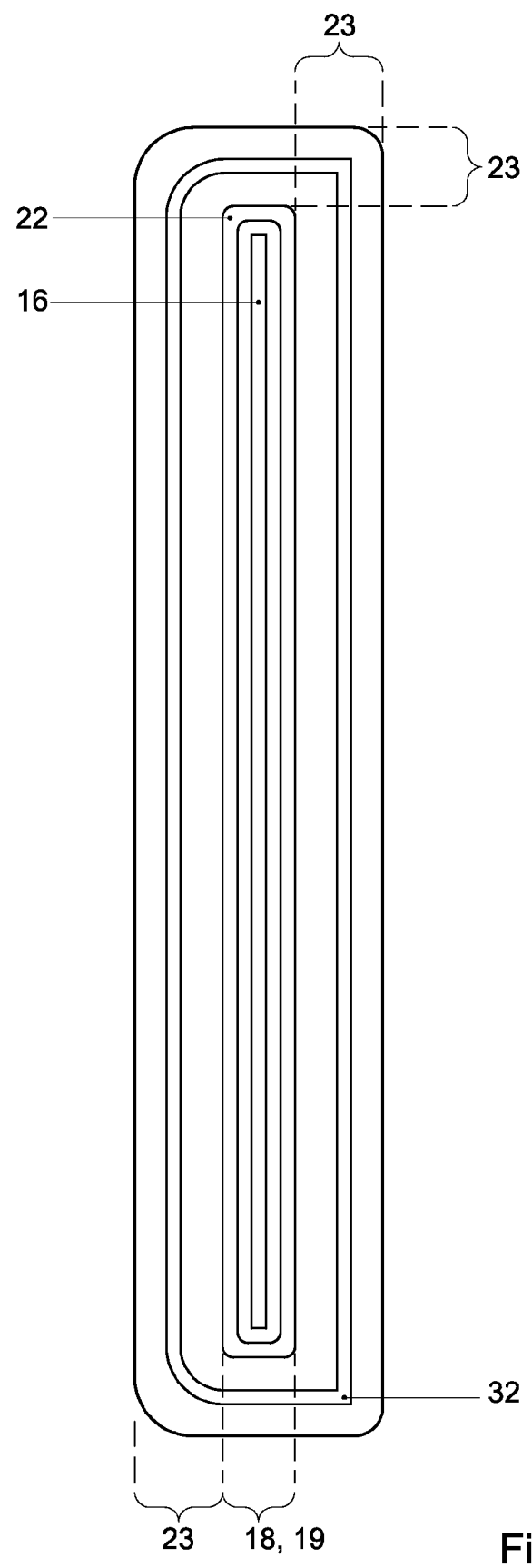
FIG. 2C shows a bottom view of a deposition device of FIGS. 2A and 2B.

FIG. 2C shows a bottom view of the deposition device of FIGS. 2A and 2B. In general, the deposition cavity 18 may be of elongate shape. A longitudinal direction of the deposition cavity may be, in use, transverse to the direction 74 of relative motion between the deposition cavity 18 and the substrate 14.

In general, the deposition cavity 18 (or the further deposition cavity 18') may be present in a cavity 19, as indicated in FIGS. 2A-C. The deposition cavity 18 may be laterally, i.e. in a direction of the substrate surface, restricted by the cavity 19. Hence, laterally the deposition cavity 18 may only extend within the cavity. In use the cavity may face the substrate. The precursor drain and the precursor supply may be positioned in the cavity. The cavity may be surrounded at all sides by a projecting portion 23. The projecting portion 23 is projected with respect to a bottom 27 of the cavity. The precursor drain 16 and the precursor supply 22 may be positioned in the bottom of the cavity 19. The cavity may have a distinct advantage for optimising process conditions. It may be appreciated that, in an embodiment, a depth of the further deposition cavity may be substantially zero. Then, the further deposition cavity is a further deposition space. However, alternatively, the further deposition cavity 18' may have a non-zero depth.

FIG. 3A shows an embodiment of the plasma device in a cross section B-B' shown in FIG. 1. The plasma device comprises a first electrode 52, in this example plurality of first electrodes 52.$i$ ($i=1, 2, 3, \ldots$). The plasma device also has a second electrode 54 and a high-voltage source 56 for generating a voltage difference between the first electrodes 52.$i$ and the second electrode 54. In general, the plasma is generated near, e.g. on, the surface so that it contacts the surface to enable patterning the surface, e.g. by realising a patterned hydrophobicity on the surface 12. In general, the high-voltage source may be arranged for generating a voltage larger than 100, 500, 1000, 2000, 5000, or 10000 volts. Based on the gas in which the plasma is going to be formed and a separation between the first electrode and the second electrode, the minimum voltage of the high-voltage source may be choosen. It will be clear that, if a separation between the first and second electrode is rather small, a high-voltage source arranged for generating a voltage smaller than 100 volts may be used, e.g. the high-voltage source may be arranged for generating a voltage larger than 10 volts.

In this example, the first electrodes 52.i are designed as elongate pens. In this example, the second electrode 54 is plate-shaped. The first and second electrodes 52.i, 54 are electrically conducting connected to terminals 58,60 of the high-voltage source 56 respectively. The high-voltage source 56 may be arranged for generating a high-voltage difference between the first electrodes 52.i and the second electrode 54 that is high enough for generating the plasma 62. In this example, the first electrodes 52.i are also connected to ground at 64. It will be appreciated that the first electrodes may be negatively charged with respect to the second electrode or vice versa, e.g. depending on whether ions or electrons are desired to impact onto the substrate. In this example, the voltage difference comprises a DC voltage difference. Alternatively, or additionally, the high voltage difference may comprise an AC voltage difference (e.g. radiofrequent (RF)), pulsed voltage difference, etc.

In this example a substrate 14 to be treated is positioned in between the first electrodes 52.i and the second electrode 54, in this example on top of the second electrode 4. The second electrode 54 of this example is also referred to as counter electrode.

In FIG. 3A the plasma device 6 may further comprises a housing 66. The housing 66 comprises a plurality of bores 68.i (i=1, 2, 3, . . . ) in each of which one first electrode 52.i may be housed. Each first electrode 62.i is slidably housed in its respective bore 18.i. In this example, the plasma device 6 comprises an electrode positioner arranged for individually moving each one of the first electrodes 52.i in its respective bore 68.i. The electrode positioner may comprise an electric motor, such as a linear motor, a rack and pinion, a piezoelectric actuator, an electromagnetic solenoid or the like. The electrode positioner may thus be arranged for relative positioning of the first electrode 52.i and the substrate 14.

The plasma device 6 as discussed thus far may be operated in the following manner.

First the substrate 14 is placed between the second electrode 4 and the first electrodes 52.i. A high voltage difference is set and maintained between the first and second electrodes.

When the surface 12 of the substrate 14 is to be selectively treated with a plasma, the location where the surface 12 is to be treated is determined. The first electrode 52.i closest to the determined location on the surface is selected. In this example, first electrode 52.3 is selected.

Initially all first electrodes 52.i may be in a retracted position, as shown for first electrodes 52.1, 52.2, 52.4, 52.5, and 52.6 in FIG. 3A. In this retracted position, also referred to as a second position, the distance between the tip (discharge portion) of the first electrode 52.i and the second electrode 54 is sufficiently large to prevent plasma discharge at the high voltage difference. That is, the electric field strength between the first electrode 52.i in the retracted position and the second electrode 54 is sufficiently low to prevent electrical breakthrough.

The electrode positioner moves the selected first electrode 52.3 towards the second electrode 54 into an extended position (see FIG. 3A), also referred to as a first position. In this extended position, the distance between the tip (discharge portion) of the selected first electrode 52.3 and the second electrode 54 is sufficiently small to support the plasma discharge at the high voltage difference. That is, the electric field strength between the first electrode in the extended position and the second electrode 54 is sufficiently high to support the onset of a plasma discharge. In FIG. 3A the plasma is indicated at 62.

Since the electric field between the first and second electrodes may pass through the substrate, the plasma device according to FIG. 3A is suitable for sheet-shaped substrates, such as plastics foils.

The fact that the first electrodes can be retracted provides the advantage that there may be less erosion of the first electrodes adjacent to the first electrode that generates the plasma, because the plasma will not reach the retracted first electrodes. This effect will be improved by completely retracting the first electrodes into the housing (as shown in FIG. 3A), especially if the housing 16 comprises an electrically insulating bottom near the plasma. This also applies to other variants of the plasma device 6. It will be appreciated, however, that it is not strictly necessary that the electrodes are enclosed by the housing 16. The housing may also comprise a substantially open structure for guiding the electrodes.

By steering the distance between a first electrode and the second electrode, the intensity of the plasma can be steered.

Since the distance between the first electrodes and the surface of the substrate can be controlled, the treatment of curved surfaces and/or 3-dimensional objects may be feasible (possibly in combination with a second electrode that is not flat but follows the shape of the substrate).

The apparatus 2 may provided with the apparatus controller for controlling the extending and rectracting of the first electrodes by steering the electrode positioner. Thus, by means of the apparatus controller, the apparatus may be arranged for generating the plasma discharge selectively in time and/or position, for patterning the surface of the substrate by means of the plasma so that the portion of the substrate contacted by the precursor gas selectively overlaps with the portion of the substrate contacted by the plasma.

FIG. 3B schematically shows how the piezoelectric actuator, comprised by the electrode positioner, can be used in the plasma device 6, or in a method according to the invention. FIG. 3B shows a first piezoelectric actuator 70A and a second piezoelectric actuator 70B. FIG. 3B shows the second piezoelectric actuator 70B in an extended position. This can be achieved by providing a voltage over the second piezoelectric actuator 70B by means of a piezo voltage source 56' associated with the piezoelectric actuators. The piezo voltage source 56' may be formed by the high-voltage source 56. FIG. 3B shows the first piezoelectric actuator 70A in a retracted position. This can be achieved by, at least partly, releasing a voltage over the first piezoelectric actuator 70B by means of the piezo voltage source 56' associated with the piezoelectric actuators. The piezo voltage source 56' associated with the piezo-electric actuators may be formed by the high-voltage source 56 or can be separate from the high-voltage source 56. It will be appreciated that the piezoelectric actuator allows precise extension, i.e. positioning, of the first electrode. In the example of FIG. 3B the first electrode 52.1, 52.2 is carried by the piezoelectric actuator 70A, 70B, respectively. It will also be appreciated that it is also possible that the first electrode is entirely formed by a piezo-electric actuator, optionally provided with an additional electrically conducting coating on at least a portion of the outer surface thereof at or near a, in use, discharge portion of the first electrode.

FIG. 3C shows another embodiment of the plasma device 6. In this embodiment a conventional inkjet print head 35 is converted for the purpose of providing the plasma discharge. In this example, the inkjet print head comprises a plurality of nozzles 37.n (n=1, 2, 3, . . . ). Per nozzle, two piezo-electric elements 31,33 are positioned adjacent an internal ink chamber 39. According to the modification, the piezo-electric elements 31,33 are electrically conducting connected to the terminals 58,60 of the high-voltage source 56, respectively.

When a high voltage difference is maintained between the piezo-electric elements 31,33, these act as the first and second electrodes 52.i, 54.j.

The device of FIG. 3C may be operated as follows. Instead of an ink, a gas flow is fed into the print head 35, as indicated with arrow G. When the surface 12 of the substrate 14 is to be selectively treated with a plasma, the location where the surface 12 is to be treated is determined. The nozzle 37.n and the associated first electrode 52.i and second electrode 54.j closest to the determined location on the surface are selected. In this example, first electrode 52.3 and second electrode 54.3 are selected.

Initially all first electrodes 52.i and all second electrodes 54.j may be disconnected from the high voltage source 56, so that no plasma discharge is generated. The selected first electrode 52.3 and the selected second electrode 54.3 are connected to the high voltage source 56 via switches 24.5 and 24.6, respectively. Then, in the region between the electrodes, the plasma 62 will be generated. Due to the velocity of the gas flow, the plasma 62 will be ejected from the nozzle 37.3 towards the surface 12 of the substrate 14. It will be appreciated that the modified inkjet head 35 may be scanned along the surface 12.

The switches may be comprised by the apparatus controller. The apparatus controller may thus be coupled to the high-voltage source. It may thus be clear that, more in general, the apparatus controller, by means of the switches for selecting a first electrode through which a plasma will be generated, may be arranged for generating the discharge selectively in time and/or position.

FIG. 3D shows a further embodiment of the plasma device 6 for generating a plasma discharge, suitable for maskless direct patterning of a substrate 14 according to the invention, i.e. no mask that is provided with the pattern is used. In this example, the device 6 is specially adapted for patterning the surface 12 of a three-dimensional substrate 14.

In this example, the electrodes 52.i, 54.j are individually movable in a direction towards and away from the substrate 14, e.g. as described with respect to FIGS. 3A-C. In this example, each electrode 52.i, 54.j is provided with an electrical insulation 28.k mounted fixed with respect to that electrode. Hence, the electrodes 52.i, 54.j are well protected against erosion.

The device 6 as shown in FIG. 3D may be operated in the following manner.

The substrate 14 is placed near the first and second electrodes, 52.i, 54.j. All electrodes 52.i, 54.j are positioned towards the substrate 14 until each electrode touches the surface 12 of the substrate 14. Next all electrodes 52.i, 54.j are moved away from the surface 12 over a predetermined distance, suitable for generating the plasma 62 for treating the surface 12. Now the electrodes "follow" the contour of the surface 12. Although FIG. 3D shows a one-dimensional array of electrodes, a two-dimensional array of electrodes 52.i, 54.j is preferred to allow treatment of a surface area of the surface 12 of a three-dimensional substrate.

However, an alternative way of following the substrate may be used as well. Thereto the plasma device 6, or the apparatus 2 comprising the plasma device 6, may comprise the gas bearing and the bearing gas injector 32 arranged for injecting the bearing gas between the apparatus and the substrate surface, the bearing gas thus forming the gas bearing. FIG. 3D shows the gas bearing 34 that may be present. Flow of the bearing gas is indicated by arrows 20.

The high voltage difference is set. When the surface 12 of the substrate 14 is to be selectively treated with a plasma, the location where the surface 12 is to be treated is determined. Thereto the apparatus controller may comprise a computer that is provided by a user with information about the pattern that is to be generated. The first electrode 52.i and the second electrode 4.j closest to the determined location on the surface are selected by the apparatus controller. In this example, first electrode 52.2 and second electrode 54.2 are selected.

Initially all first electrodes 52.i and all second electrodes 54.j may be disconnected from the high voltage source 56, so that no plasma discharge is generated. The selected first electrode 52.2 and the selected second electrode 54.2 are connected to the high voltage source 56 via switches 24.3 and 24.4, respectively. The switches may be comprised by the apparatus controller.

In the example of FIG. 3D, shields 30.m (m=1, 2, 3, ...) are mounted in between the electrodes 52.i, 54.j. In this example, the shields are formed by (electrically insulating) foils. The shields 30.m prevent the plasma 62 from entering in an open space 82 between the electrodes 52.i, 54.j. The shields 30.m also allow a gas to be entered into the discharge space 134, while preventing the gas from entering the open space 82 between the electrodes. It will be appreciated that the gas in the discharge space 134 can be chosen to promote plasma discharge. The gas may e.g. comprise Argon or Helium. The gas not being present in the open space 82 may cause the high voltage difference to be unable to cause the plasma discharge in the open space 82. It will be appreciated that these shields 30.m are optional, and may, if desired, also be applied in the device according to FIG. 3A.

FIG. 3E schematically shows how the gas can be entered into the discharge space 134. The plasma device 6 may be provided with a gas supply, e.g. an inlet tube 13A, for supplying the gas, for forming the plasma therein, towards the first electrode 52. The plasma device 6 may further be provided with a gas drain, e.g. an outlet tube 13B, for draining the gas away from the first electrode and/or the substrate. The plasma device 6 may further be provided with an enclosure 13C that surrounds the first electrode 52. The enclosure 13C may be in fluidum communication with the inlet tube 13A, so that the gas in use flows out of the inlet tube 13A directly into the enclosure 13C. The inlet tube 13A and the outlet tube 13B may be placed in such a way that, before reaching the outlet tube 13B, the gas has to flow out of the enclosure 13C. By means of the inlet tube, the outlet tube, and the enclosure a focussed gas stream may be effectuated. It may be clear however, that a focussed gas stream may also be reached without the enclosure 13C. It is also possible that the outlet tube 13B mouths into the enclosure 13C.

FIG. 3F shows a yet further embodiment of the plasma device 6. In this embodiment a conventional inkjet print head 35 is converted for the purpose of providing the plasma discharge. In this example, the inkjet print head comprises a plurality of nozzles 37.n (n=1, 2, 3, ...). According to the modification, needle-shaped first electrodes 52.i are mounted to extend through the internal chambers 39 of the head.

The needle-shaped first electrodes may in general e.g. have a diamond tip, e.g. provided with an electrically conductive coating. In this way the first electrodes can be provided with a relatively sharp tip. Hence, a size of the plasma can be reduced. Thus, a spot size or track width during patterning can be reduced.

The first electrodes 52.i are electrically conducting connected to the terminal 58 of the high voltage source 56. An intermediate structure such as a pinhole plate 76A may be electrically conducting connected to the terminal 60 of the high voltage source 56 and acts as second electrode 54. In this example, the first electrodes are switched through the switches 24.i. It will be appreciated that the first electrodes 52.*i* may also be arranged to be moveable from a retracted position to an extended position as indicated e.g. with respect to FIG. 3A, 3B or 3D.

In the example of FIG. 6B, a gas may be caused to flow through the nozzles 37.*n*, around the first electrodes 52.*i*. The gas may e.g. comprise a precursor or reactant gas or a depositable material.

It will be appreciated that other conventional inkjet heads may also be converted for forming the plasma device according to the invention. It is for instance possible that the first electrode is formed by a piezo-electric element of the print head while the second electrode is formed by an electrically conducting nozzle plate surrounding the nozzle. It is also possible that an alternative electrically conducting structure within the conventional inkjet print head, such as an electrical heating resistor forms an electrode for generating the plasma.

The inventors realized that a commercially available matrix printer can easily be converted to an apparatus or a plasma device according to one or more of FIGS. 1-3E.

Converting a conventional matrix printer could be performed as follows. A modification kit in an embodiment according to the invention may be used.

First, a conventional matrix printer is provided, and a high voltage source for generating a high voltage difference is provided. At least one printing pen of the print head of the matrix printer is electrically conducting connected with the high voltage source.

For example, an outer surface of a print drum of a conventional matrix printer may be electrically conducting connected with the high voltage source. If required, the surface of the print drum may be provided with an electrically conducting coating.

If a device according to FIGS. 3A-E is desired, at least one printing pen of the print head is connected to the positive terminal of the high voltage source, while at least one other printing pen of the print head is connected to the negative terminal of the high voltage source.

When more than two first electrodes 52.*i* and/or second electrodes 54.*j* are used, they can be arranged in a 1- or 2-dimensional array. A smart way to separate the electrodes in such an array from each other is with a membrane as described in patent WO 2008/004858, incorporated herein by reference. In this way, the electrodes 52.*i*, 54.*j* can be placed close together, e.g. in a hexagonal packing, with a membrane separating individual electrodes. When the membrane is electrically insulating, the electrodes are electrically isolated from each other as well. Another advantage of the arrangement and method of pin movement described in WO 2008/004858 is that the electrodes can be moved individually without influencing each other.

While FIGS. 1, 2A, 2B, and 3A-3D relate to possible embodiment of the apparatus, having the deposition device and the plasma device, various other variants are possible.

For example, the plasma device 6 may further be provided with an intermediate structure that is, in use, arranged in between the substrate 14 and at least one, e.g. all, of the first electrodes 52.*i*. FIG. 4 shows an example of a plasma device having such an intermediate structure 76. The intermediate structure in this example is formed as a sheet. The sheet may comprise a pinhole plate 76A and/or a ribbon 76B provided with at least one aperture 80, in this example with a plurality of apertures. In the example of FIG. 4, the pinhole plate essentially consists of an electrically non-conductive material such as ceramic. However, in other example, the pinhole plate may be provided with an electrically conductive material.

Then, the pinhole plate 86A may form the second electrode 54. The ribbon 76B may be provided with a carrier sheet, although this is not necessary.

Through the apertures 80, the generated plasma 62 can be provided towards the substrate 14. Thus, in use, the plasma can reach the substrate through the apertures 80, optionally interacting with the ribbon 76B if this ribbon is present. As a result of such interacting, a process material that is comprised by the ribbon may be released by means of the plasma. The process material may e.g. be used as precursor material or reactant material in an atomic layer deposition process, or e.g. as precursor material in a chemical vapour deposition process. The gas for forming the plasma may be provided in between the intermediate structure and the substrate 14. Flow of the gas is indicated by arrow G.

While FIG. 4 shows the pinhole plate 76A in a side view, FIG. 4A shows the pinhole plate 76A in a top view. A diameter $D_A$ of an aperture is indicated. A maximum dimension for the apertures may be defined. For the approximately circular apertures 80 of this example, the maximum dimension may be the diameter $D_A$. The diameter $D_A$ can optionally be smaller than, e.g. at least two times smaller than, a minimum distance $D_E$ between the first electrode and the substrate. In this way a spot size or track width S of a pattern generated by the plasma can be significantly reduced. However, alternatively, the diameter $D_A$ may, optionally, be larger than or equal to the minimum distance $D_E$ between the first electrode and the substrate.

The pinhole plate may also be provided in the variant of FIG. 3A or 3C. It will be appreciated that it is also possible in the embodiment of FIG. 3C that the pinhole plate is electrically conductive and functions as the second electrode. In this case only one electrode of the inkjet print head, e.g. one piezo-electric element, in the internal chamber 39 is required for forming the first electrode.

FIG. 5 shows an embodiment of the apparatus 2 in a cross section C-C' shown in FIG. 1. In the example of FIG. 5, the deposition device and the plasma device are integrated to include one apparatus head 104. FIG. 5 shows the precursor supply 16, the precursor drains 22, and the deposition cavity 18. The apparatus 2 further comprises a plasma device having the first electrode 52 and the second electrode 54. The apparatus 2 further has the high-voltage source 56 (not drawn in FIG. 5 but visible in FIGS. 3 and 5).

In FIG. 5, the first electrode and the second electrode are positioned in synchronism along the surface of the substrate. Such positioning can e.g. be realised by moving the substrate 14 along the apparatus head 104, and/or by moving the apparatus head 104 along the substrate 14. In this embodiment, the electrode positioner is formed by the deposition positioner. Both the electrode positioner and the deposition positioner may be formed by a conveying system for the substrate. Such a conveying system may comprise a roll-to-roll system or a moveable substrate table 41. In general, the substrate may be a flexible substrate.

The plasma device 6 of the apparatus 2 may in general be provided with a plasma supply 106 and the further deposition cavity 18'. In use, a gas wherein the plasma is to be formed, e.g. argon gas, may be fed into the plasma supply towards the substrate 14. The reactant gas may in use be injected through the plasma supply 106, e.g. when performing atomic layer deposition. Thus, more in general, the plasma device may be provided with a reactant gas supply for, in use, supplying the reactant gas. The reactant gas supply may be formed by the plasma supply 106. By means of the plasma, the reactant gas and the precursor gas material present on the substrate may be reacted to form an atomic layer. The plasma device may be provided with additional drains 108, e.g. plasma-gas drains, for draining excess gas, which may e.g. comprise excess reactant gas and/or plasma-gas.

When the surface 12 of the substrate 14 is to be selectively treated with a plasma, the location where the surface 12 is to be treated is determined. The plasma supply 106 and the associated first electrode 52 and second electrode 4 closest to the determined location on the surface are selected, as the apparatus head 104 may be provided with the plurality of first electrodes 52.i and the plurality of second electrodes 54.i. Initially all first electrodes and all second electrodes may be disconnected from the high high-voltage source 56, so that no plasma discharge is generated. The selected first electrode 52 and the selected second electrode 54 may be connected to the high-voltage source 56 via switches. Then, in the region between the electrodes in the further deposition cavity 18', the plasma 62 can be generated. Due to the velocity of the gas flow out of the plasma supply, the plasma 62 can be ejected from the plasma supply towards the surface 12 of the substrate 14. It will be appreciated that the apparatus head 104 may be scanned along the surface 12 by means of the electrode positioner and the deposition positioner, which may be integrated into one conveyor system for the apparatus head 104 and/or the substrate 14.

More in general, by suitable purging of spaces 18, and 18', the supplies 16 and 106 may be switched during processing.

In FIG. 5, the direction 74 of relative motion between the deposition cavity 18 and the first electrode 52 on the one hand, and the substrate 14 on the other hand, is indicated. This relative motion may be realised by the conveying system. The first electrode 52 and the deposition cavity 18 are positioned in the apparatus along the direction 74. As a result, in use a portion of the substrate surface may first be treated by the deposition device and may later be treated by the plasma device, or vice versa. As a result, the portion of the substrate treated by the deposition cavity may overlap with a portion of the substrate treated by the plasma.

In general, the deposition cavity 18 defines a deposition cavity height $D_2$ relative to the substrate surface 12. The gas bearing 34, which may function as flow barrier, may comprises a flow restricting surface 11 facing the substrate surface 12, defining, relative to the substrate, a gap distance $D_1$ which is smaller than the deposition cavity height $D_2$. A dimension $C_2$ of the flow restricting surface 11 may typically be in a range from 1 to 30 millimeter. A distance $C_1$ between the precursor drains 22 may typically be in a range from 1 to 10 millimeter, which is also a typical length of the deposition cavity 14 in the plane of the substrate 6. A typical height of the gas-bearing layer, indicated by $D_1$, may be in a range from 3 to 15 micrometer. A typical height $D_2$ from a bottom of the deposition cavity 18 to the substrate, measured out of the plane of the substrate 6, may in use be in a range from 3 to 100 micrometer. All of these are considered to be efficient values. A height $D_3$ from a bottom of the further deposition cavity 18' to the substrate may in use be similar to the height $D_2$ of the deposition cavity 18. However, the height $D_3$ associated with the further deposition cavity 18' may alternatively be different from, e.g. larger than or smaller than, the height $D_2$ associated with the further deposition cavity 18'.

The apparatus 2 may comprise the apparatus controller 110 for controlling at least the electrode positioner and the deposition positioner, in this example both formed by the substrate table 41, via connection 112A. The apparatus controller 110 may further be arranged for controlling the generation of the voltage difference via connection 112B. For example, the apparatus controller 110 may control a moment in time at which the plasma in being generated, i.e. a time at which plasma generation starts and a time at which plasma generation stops, preferably repeatedly. Hence, the apparatus 2 is provided with the apparatus controller 110 that is coupled to the high-voltage source and/or the electrode positioner for generating the plasma discharge selectively in time. This enables patterning the surface of the substrate by means of the plasma so that a portion of the substrate contacted by the precursor gas selectively can overlap with a portion of the substrate contacted by the plasma. Via connection 112B, also flow of the gas wherein the plasma is to be formed may be regulated. Optionally, in general another reaction gas may be provided.

The apparatus controller 110 may further be arranged for controlling the injection of the precursor gas via the precursor supply and the bearing gas via bearing-gas injectors 32. Thereto the gas controllers 105 for controlling injection of the bearing gas and the gas controller 103 for controlling injection of the precursor gas may be provided. The controllers may be controlled via connections 105A and 103A. These gas controllers may be comprised by the apparatus controller 110.

The controller may thus be arranged for realising patterned deposition of the atomic layer. For example, in use patterning the substrate by means of the plasma may precede depositing the atomic layer on the substrate for depositing the atomic layer on the patterned substrate. As another example, the apparatus controller may in use control the apparatus head 104 so that injecting a precursor gas from the precursor supply into the deposition cavity for contacting the substrate surface precedes generating the plasma discharge near the substrate, so that in use the plasma reacts precursor-gas material that is present on the substrate for forming the atomic layer on the substrate or for removing the precursor-gas material that is present on the substrate.

The apparatus 2 may further be arranged for relative positioning of the precursor supply and the substrate out of the plane of the substrate surface. Thereto the deposition device may further comprise the gas injector 32 for injecting a gas between the apparatus head and the substrate surface, the gas in use forming the gas-bearing layer 34. In FIG. 5, the gas injector is formed by the bearing-gas injector 32 for creating the gas-bearing layer, while the bearing-gas injector is separate from the precursor supply.

FIG. 5A shows an example wherein the first electrode 52.2 is formed by a hollow needle. Gas flowing out of the hollow needle is indicated by arrow $G_1$. More in general, the plasma device 6 and/or the apparatus 2 may be provided with the gas drain 13B around the hollow needle 52.2. Flow of drained gas is indicated by arrow $G_2$. By means of the gas flow $G_1$ and/or $G_2$, effective cooling of the first electrode, e.g. the hollow needle, may be achieved. It may be clear however that the hollow needle may alternatively be a solid needle.

In addition, or alternatively, to the needle-like first electrodes 52.1, 52.2, 52.3 and the plate-like second electrode 54 as shown in FIG. 5A, other first and second electrodes 52A.i, 54A.i and/or 52B.i, 54B.i may be provided, alone or in combination. A pair of a first and second electrode 52A.i, 54A.i; 52B.i, 54B.i may be in close proximity with a plasma supply that is associated with the electrode pair. This may offer, in general, the advantage of a relatively small size and a relatively small switching time for the plasma.

FIG. 5B shows a bottom view of a further deposition cavity 18' provided with a plurality of first electrodes 52.i and a plurality of second electrodes 54.i. FIG. 5B shows the bottom 27 of the cavity and the projecting portion 23.

FIG. 5C shows a detail 114 of FIG. 5B. More in general, the first electrode 52.i and the second electrode 54.i may be positioned around, and preferably near e.g. in close proximity to, the plasma supply 106 and possibly the reactant supply 116. With such a configuration for the plurality of first electrodes 52.i and the plurality of second electrodes 54.i, the size of the plasma can be relatively small. As a result, the resolution of a pattern generated by means of the apparatus can be relatively high. An additional advantage is that, because of the close proximity of the first and second electrodes to the plasma supply 106, a time needed to ignite the plasma and a time needed to extinguish the plasma may be relatively small. This may enable an increased throughput speed of the substrate along the apparatus 2.

It may, more in general, be clear that the structures as shown in FIGS. 3A-F may be provided in one further deposition cavity, along one or two mutually perpendicular directions along the bottom of the cavity.

The invention may include other aspects. For example, the substrate may be a plastic substrate or a substrate provided with an organic material. Such substrates may be relatively vulnerable for high temperatures. Because the invention may enable generating the plasma only locally, exposing the whole substrate to a high temperature that may be needed for obtaining an atomic layer from the precursor gas material, may be omitted. The apparatus may optionally be integrated in a single wafer reactor to advantage. A method according to the invention may optionally be repeated so as to obtain a stack of, preferably patterned, atomic layers. However, the stack of atomic layers may also include non-patterned layers. A method according to the invention and/or an apparatus according to the invention may optionally be used to advantage for coating paper, for applying a ophthalmic coating, to coat free-form surfaces such as ophtalmics, to coat mineral glass, and/or to coat an organic material. A method according to the invention and/or an apparatus according to the invention may optionally be used to advantage for deposing a barrier coating, a hard coat, and/or an antireflex coating. A method according to the invention and/or an apparatus according to the invention may optionally be used for applying a multifocal layer that may be used for producing glasses, such as varilux glasses. A method according to the invention and/or an apparatus according to the invention may optionally be used for colorisation of ophthalmics. The invention may provide a modification kit comprising a high voltage source and a print head for use in an apparatus according to the invention, preferably arranged for carrying out a method according to the invention. The modification kit preferably further comprises a gas inlet for guiding a gas towards a first electrode of the print head. The modification kit is preferably further be provided with an intermediate structure. The plurality of first electrodes may optionally be comprised by a hammerbank, e.g. a hammerbank as described in U.S. Pat. No. 6,779,935 B1. A method according to the invention may optionally include depositing, in overlap with a patterned ALD or CVD layer, a essentially non-patterned layer by means of chemical vapour deposition. The invention may also provide a device for patterning the surface of a substrate using a fast plasma assisted ALD (Atomic Layer Deposition) or CVD (Chemical Vapour Deposition) process, comprising: a shower head which provides the process gasses and precursors; a first electrode having a first discharge portion and a second electrode having a second discharge portion, a high voltage source for generating a high voltage difference between the first and the second electrode, and positioning means, e.g. the electrode positioner, for positioning the first electrode with respect to the substrate, wherein the positioning means are arranged for selectively positioning the first electrode with respect to the second electrode in a first position in which a distance between the first discharge portion and the second discharge portion is sufficiently small to support the plasma discharge at the high voltage difference, and in a second position in which the distance between the first discharge portion and the second discharge portion is sufficiently large to prevent plasma discharge at the high voltage difference, wherein the plasma facilitates the patterned formation of a ALD layers and/or CVD layers.

The specifications, drawings and examples are, accordingly, to be regarded in an illustrative rather than in a restrictive sense. Hence, the invention is not limited to the embodiments and variants described herein. For example, the methods described herein may be carried out, and/or the apparatuses may be used, under atmospheric conditions, under vacuum conditions, or under a wide range of controlled pressure conditions.

In the claims, any reference signs placed between parentheses shall not be construed as limiting the claim. The word 'comprising' does not exclude the presence of other features or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. Method for depositing a layer on a surface of a substrate by means of a deposition device, the deposition device comprising a deposition cavity provided with a precursor supply and a precursor drain, the deposition cavity in use being bounded by the deposition device and the substrate surface, the method comprising injecting a precursor gas from the precursor supply into the deposition cavity for contacting the substrate surface, draining part of the injected precursor gas from the deposition cavity, and positioning the deposition cavity and the substrate relative to each other along a plane of the substrate surface, the method further comprising providing a first electrode and a second electrode, positioning the first electrode and the substrate relative to each other, and generating a plasma discharge near the substrate for contacting the substrate by generating a high-voltage difference between the first electrode and the second electrode, wherein the method comprises generating the plasma discharge selectively in time and/or position, for patterning the surface of the substrate by means of the plasma so that a portion of the substrate contacted by the precursor gas selectively overlaps with a portion of the substrate contacted by the plasma, the method further including forming a gas-bearing layer by injecting, by means of a bearing-gas injector of the apparatus, a bearing gas between the apparatus and the substrate surface.

2. Method according to claim 1, wherein patterning the substrate precedes depositing the layer on the substrate so that the layer is deposited on the patterned substrate.

3. Method according to claim 1, wherein injecting the precursor gas from the precursor supply into the deposition cavity for contacting the substrate surface precedes generating the plasma discharge near the substrate so that the plasma reacts precursor-gas material that is present on the substrate for forming the layer on the substrate or for removing the precursor-gas material that is present on the substrate.

4. Method according to claim 1, wherein injecting the precursor gas from the precursor supply into the deposition cavity for contacting the substrate surface is carried out simultaneously with generating the plasma discharge near the substrate.

5. Method according to claim 1, including selectively generating the plasma discharge by positioning the first electrode with respect to the second electrode in a first position in which a distance between the first electrode and the second electrode is sufficiently small to support the plasma discharge at the high voltage difference, and selectively extinguishing the plasma discharge by positioning the first electrode with respect to the second electrode in a second position in which the distance between the first electrode and the second electrode is sufficiently large to prevent plasma discharge at the high voltage difference.

6. Method according to claim 5, comprises moving the first electrode in a direction towards the second electrode when moving the first electrode into the first position and moving the first electrode in a direction away from the second electrode when moving the first electrode into the second position.

7. Method according to claim 1, comprising positioning the first electrode and second electrode in synchronism along the surface of the substrate.

8. Method according to claim 1, comprising supplying a gas for forming the plasma therein towards the first electrode and/or the substrate, and/or comprising draining a gas away from the first electrode and/or the substrate.

9. Apparatus for performing a method in accordance with claim 1, comprising a deposition device for layer deposition, such as atomic layer deposition or chemical vapour deposition, on a surface of a substrate, the deposition device comprising a precursor supply, a precursor drain, and a deposition cavity that in use is bounded by the deposition device and the substrate surface, wherein the deposition device is arranged for injecting a precursor gas from the precursor supply into the deposition cavity for contacting the substrate surface, and is arranged for draining at least part of the injected precursor gas through the precursor drain from the deposition cavity, wherein the deposition device comprises a deposition positioner arranged for positioning of the deposition cavity and the substrate relative to each other along a plane of the substrate surface, the apparatus further comprising a plasma device having a first electrode, a second electrode, and a high-voltage source, the plasma device further having an electrode positioner for relative positioning of the first electrode and the substrate, the plasma device being arranged for generating a plasma discharge near the substrate for contacting the substrate surface by generating a voltage difference between the first electrode and the second electrode by means of the high-voltage source, wherein the apparatus is provided with an apparatus controller that is coupled to the high-voltage source and/or the electrode positioner for generating the plasma discharge selectively in time and/or position, for patterning the surface of the substrate by means of the plasma so that a portion of the substrate contacted by the precursor gas selectively overlaps with a portion of the substrate contacted by the plasma, the apparatus further comprising bearing gas injector arranged for injecting a bearing gas between the apparatus and the substrate surface, the bearing gas thus in use forming a gas bearing.

10. Apparatus according to claim 9, wherein the first electrode and the deposition cavity are positioned in the apparatus along a direction of relative motion realised by the deposition positioner so that, in use, a portion of the substrate treated by the deposition cavity overlaps with a portion of the substrate treated by the plasma.

11. Apparatus according to claim 9, wherein the electrode positioner is arranged for selectively positioning the first electrode with respect to the second electrode in a first position in which a distance between the first electrode and the second electrode is sufficiently small to support the plasma discharge at the high voltage difference, and in a second position in which the distance between the first electrode and the second electrode is sufficiently large to prevent plasma discharge at the high voltage difference.

12. Apparatus according to claim 9, wherein the electrode positioner is arranged for moving the first electrode in a direction towards and away from the second electrode.

13. Apparatus according to claim 9, wherein the electrode positioner is arranged for positioning the second electrode in synchronism with the first electrode.

14. Apparatus according to claim 9, provided with a plasma-gas supply for supplying a gas for forming the plasma therein toward the first electrode and/or the substrate, and/or provided with a plasma-gas drain for draining a gas away from the first electrode and/or the substrate.

15. Method for manufacturing a light-emitting diode from a stack of atomic layers, or for manufacturing a meso-scale electronics device, such as an (O)LED device, an RFID tag or a solar-cell device; a meso-scale three dimensional structure, such as a MEMS device, a micro-lens or a multi-focus lens; a lab-on-chip; a biochip; a printable plastics object or an offset printing plate from a substrate, by depositing at least one, preferably patterned, atomic layer or chemical vapour deposition layer by the method of claim 1.

* * * * *